(12) United States Patent
Jeong et al.

(10) Patent No.: US 12,119,437 B2
(45) Date of Patent: Oct. 15, 2024

(54) LIGHT EMITTING DEVICE PACKAGE

(71) Applicant: SAMSUNG ELECTRONICS CO., LTD., Suwon-si (KR)

(72) Inventors: Soonwon Jeong, Hwaseong-si (KR); Yeonjun Sung, Hwaseong-si (KR); Jongho Lim, Suwon-si (KR); Joonwoo Jeon, Seoul (KR); Hanna Heo, Suwon-si (KR); Hyongsik Won, Yongin-si (KR); Sangbok Yun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 456 days.

(21) Appl. No.: 17/533,949

(22) Filed: Nov. 23, 2021

(65) Prior Publication Data
US 2022/0209088 A1 Jun. 30, 2022

(30) Foreign Application Priority Data
Dec. 29, 2020 (KR) .......................... 10-2020-0185638

(51) Int. Cl.
*H01L 33/62* (2010.01)
*H01L 25/075* (2006.01)
(Continued)

(52) U.S. Cl.
CPC ........ *H01L 33/644* (2013.01); *H01L 25/0753* (2013.01); *H01L 25/162* (2013.01);
(Continued)

(58) Field of Classification Search
CPC ........... H01L 33/62; H01L 2224/73265; H01L 25/162; H01L 25/0753
(Continued)

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

DE 10 2011 115 314 A1 4/2013
DE 10 2013 103 409 A1 10/2014
(Continued)

OTHER PUBLICATIONS

Machine Translation of DE 102011115314 (Year: 2011).*
(Continued)

*Primary Examiner* — Christopher M Raabe
(74) *Attorney, Agent, or Firm* — Sughrue Mion, PLLC

(57) ABSTRACT

A light emitting device package includes a first molding member surrounding a heat dissipation frame, a first electrode frame, and a second electrode frame; a first semiconductor light emitting device on the heat dissipation frame and having first and second pads; a second semiconductor light emitting device on the heat dissipation frame and having first and second pads; a wavelength conversion layer on the first and second semiconductor light emitting structures; a first bonding wire connected to the first pad of the first semiconductor light emitting device and the first electrode frame; a second bonding wire connected to the second pad of the second semiconductor light emitting device and the second electrode frame; and an inter-chip bonding wire connecting the second pad of the first semiconductor light emitting device to the first pad of the second semiconductor light emitting device.

20 Claims, 15 Drawing Sheets

(51) Int. Cl.
*H01L 25/16* (2023.01)
*H01L 33/64* (2010.01)
H01L 23/00 (2006.01)
H01L 33/50 (2010.01)

(52) U.S. Cl.
CPC .............. *H01L 33/62* (2013.01); *H01L 24/48* (2013.01); *H01L 24/49* (2013.01); *H01L 25/167* (2013.01); *H01L 33/505* (2013.01); *H01L 2224/48137* (2013.01); *H01L 2224/48175* (2013.01); *H01L 2224/49109* (2013.01); *H01L 2924/12035* (2013.01); *H01L 2924/12041* (2013.01)

(58) Field of Classification Search
USPC ......................................................... 313/501
See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 10,557,596 B2 | 2/2020 | Lee et al. | |
| 10,749,092 B2 | 8/2020 | Yoon | |
| 2005/0006659 A1 | 1/2005 | Ng et al. | |
| 2012/0056227 A1 | 3/2012 | Lee et al. | |
| 2012/0273826 A1 | 11/2012 | Yamamoto et al. | |
| 2014/0231837 A1 | 8/2014 | Singer et al. | |
| 2016/0027980 A1 | 1/2016 | Hahn et al. | |
| 2016/0240751 A1* | 8/2016 | Ting ..................... H01L 33/42 |
| 2020/0303609 A1* | 9/2020 | Yoon ..................... H01L 33/62 |

FOREIGN PATENT DOCUMENTS

| | | |
|---|---|---|
| KR | 10-2008-0088140 A | 10/2008 |
| KR | 10-2009-0104577 A | 10/2009 |
| KR | 10-0970878 B1 | 7/2010 |
| KR | 10-1186644 B1 | 9/2012 |

OTHER PUBLICATIONS

Communication dated Sep. 18, 2023 issued by the German Intellectual Property Office in counterpart German Application No. 102021006401.1.

* cited by examiner

I-I'

LIGHT EMITTING DEVICE PACKAGE

CROSS TO REFERENCE TO THE RELATED APPLICATION

This application claims benefit of priority to Korean Patent Application No. 10-2020-0185638 filed on Dec. 29, 2020 in the Korean Intellectual Property Office, the disclosure of which is incorporated herein by reference in its entirety.

BACKGROUND

Example embodiments of the present disclosure relate to a light emitting device package, and more particularly, a package for a multi-chip light emitting device.

Recently, an application range of a semiconductor light emitting diode (LED) has been expanded from general indoor and outdoor lights to lights used for vehicles, and various display light sources. Such LEDs require a package which may effectively guarantee light extraction efficiency and heat dissipation performance. In particular, a high-power LED having high power consumption may require an efficient heat dissipation structure to prevent degradation of reliability caused by heat generated in light emission.

SUMMARY

An example embodiment of the present disclosure includes a semiconductor light emitting device package which may effectively dissipate heat emitted from a semiconductor light emitting device and may have a structure having improved reliability.

According to one or more embodiments, a light emitting device package is provided. The light emitting device package includes: a heat dissipation frame; a first electrode frame and a second electrode frame arranged adjacent to one side of the heat dissipation frame; a first molding surrounding the heat dissipation frame, the first electrode frame, and the second electrode frame; a first semiconductor light emitting device disposed on the heat dissipation frame, the first semiconductor light emitting device including a first semiconductor light emitting structure and a first pad and a second pad connected to the first semiconductor light emitting structure; a second semiconductor light emitting device disposed on the heat dissipation frame, the second semiconductor light emitting device including a second semiconductor light emitting structure and a first pad and a second pad connected to the second semiconductor light emitting structure; a wavelength conversion layer disposed on the first semiconductor light emitting device and the second semiconductor light emitting device; a first bonding wire connected to the first pad of the first semiconductor light emitting device and the first electrode frame; a second bonding wire connected to the second pad of the second semiconductor light emitting device and the second electrode frame; an inter-chip bonding wire connecting the second pad of the first semiconductor light emitting device to the first pad of the second semiconductor light emitting device; and a second molding disposed on the first molding and surrounding the first semiconductor light emitting device, the second semiconductor light emitting device, the first bonding wire, the second bonding wire, and the inter-chip bonding wire.

According to one or more embodiments, a light emitting device package is provided. The light emitting device package includes: a heat dissipation frame; a first electrode frame and a second electrode frame arranged adjacent to one side of the heat dissipation frame; an electrodeless frame disposed between the first electrode frame and the second electrode frame; a first molding surrounding the heat dissipation frame, the first electrode frame, the second electrode frame, and the electrodeless frame; at least one reinforcing molding disposed on the first molding and covering one area of the electrodeless frame and at least one area of the first electrode frame or the second electrode frame; a first semiconductor light emitting device disposed on the heat dissipation frame, the first semiconductor light emitting device including a first semiconductor light emitting structure and a first pad and a second pad connected to the first semiconductor light emitting structure; a second semiconductor light emitting device disposed on the heat dissipation frame, the second semiconductor light emitting device including a second semiconductor light emitting structure and a first pad and a second pad connected to the second semiconductor light emitting structure; a wavelength conversion layer disposed on the first semiconductor light emitting device and the second semiconductor light emitting device; a first bonding wire connected to the first pad of the first semiconductor light emitting device and the first electrode frame; a second bonding wire connected to the second pad of the second semiconductor light emitting device and the second electrode frame; a first inter-chip bonding wire connecting the second pad of the first semiconductor light emitting device to the electrodeless frame; a second inter-chip bonding wire connecting the first pad of the second semiconductor light emitting device to the electrodeless frame; and a second molding surrounding the first semiconductor light emitting device, the second semiconductor light emitting device, the first bonding wire, the second bonding wire, the first inter-chip bonding wire, and the second inter-chip bonding wire.

According to one or more embodiments, a light emitting device package is provided. The light emitting device package includes: a heat dissipation frame; a first electrode frame and a second electrode frame arranged adjacent to one side of the heat dissipation frame; a first molding surrounding the heat dissipation frame, the first electrode frame, and the second electrode frame; a plurality of semiconductor light emitting devices disposed on the heat dissipation frame along the one side of the heat dissipation frame and each including a first pad and a second pad, the plurality of semiconductor light emitting devices including a first semiconductor light emitting device disposed at one end of the plurality of semiconductor light emitting devices, and a second semiconductor light emitting device disposed at an opposite end of the plurality of semiconductor light emitting devices; a wavelength conversion layer disposed on the plurality of semiconductor light emitting devices; a first bonding wire connected to the first pad of the first semiconductor light emitting device and the first electrode frame; a second bonding wire connected to the second pad of the second semiconductor light emitting device and the second electrode frame; a plurality of inter-chip bonding wires that each connect the first pad of a respective one of the plurality of semiconductor light emitting devices to the second pad of another respective one of the plurality of semiconductor light emitting devices that is adjacent to the respective one of the plurality of semiconductor light emitting devices; and a second molding surrounding the plurality of semiconductor light emitting devices, the first bonding wire, the second bonding wire, and the plurality of inter-chip bonding wires.

According to one or more embodiments, a light emitting device package is provided. The light emitting device package includes: a heat dissipation frame; a first electrode frame and a second electrode frame arranged adjacent to one side of the heat dissipation frame; a plurality of electrodeless frames disposed between the first electrode frame and the second electrode frame; a first molding surrounding the heat dissipation frame, the first electrode frame, the second electrode frame, and the plurality of electrodeless frames; a plurality of reinforcing moldings disposed on the first molding and each covering areas of adjacent frames from among the plurality of electrodeless frames, the first electrode frame, and the second electrode frame; a plurality of semiconductor light emitting devices disposed on the heat dissipation frame along the one side of the heat dissipation frame and each including a first pad and a second pad, the plurality of semiconductor light emitting devices including a first semiconductor light emitting device disposed at one end of the plurality of semiconductor light emitting devices, and a second semiconductor light emitting device disposed at an opposite end of the plurality of semiconductor light emitting devices; a wavelength conversion layer disposed on the plurality of semiconductor light emitting devices; a first bonding wire connected to the first pad of the first semiconductor light emitting device and the first electrode frame; a second bonding wire connected to the second pad of the second semiconductor light emitting device and the second electrode frame; a plurality of pairs of inter-chip bonding wires, each of the pairs connected to a respective one of the plurality of electrodeless frames and an adjacent two of the plurality of semiconductor light emitting devices such that a first wire of one of the pairs connects the respective one of the plurality of electrodeless frames to the first pad of one of the adjacent two of the plurality of semiconductor light emitting devices, and a second wire of one of the pairs connects the respective one of the plurality of electrodeless frames to the second pad of another one of the adjacent two of the plurality of semiconductor light emitting devices; and a second molding surrounding the plurality of semiconductor light emitting devices, the first bonding wire, the second bonding wire, and the plurality of pairs of inter-chip bonding wires.

BRIEF DESCRIPTION OF DRAWINGS

The above and other aspects, features, and advantages of embodiments of the present disclosure will be more clearly understood from the following detailed description, taken in conjunction with the accompanying drawings, in which.

DETAILED DESCRIPTION

Hereinafter, example embodiments of the present disclosure will be described as follows with reference to the accompanying drawings.

Figure 1:
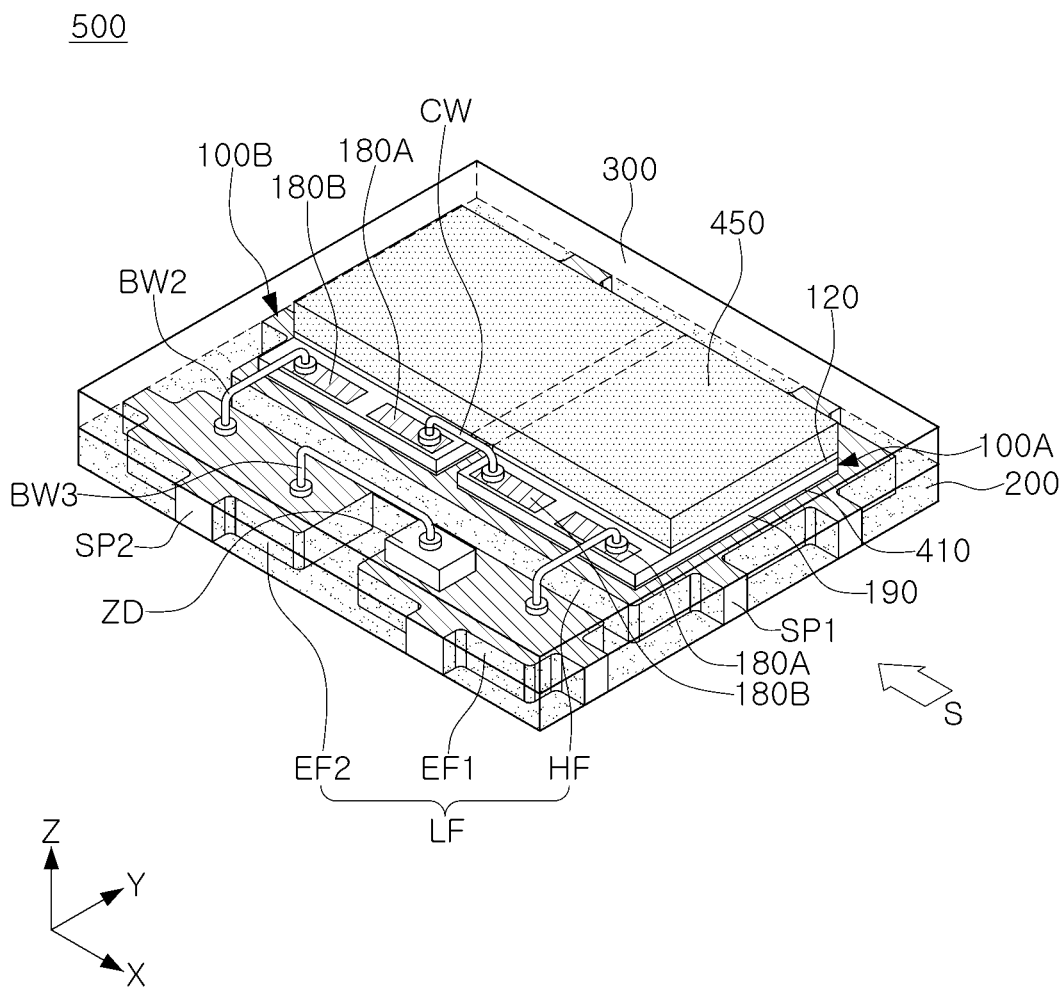
FIG. 1 is a perspective diagram illustrating a light emitting device package according to an example embodiment of the present disclosure.
Figure 2A:
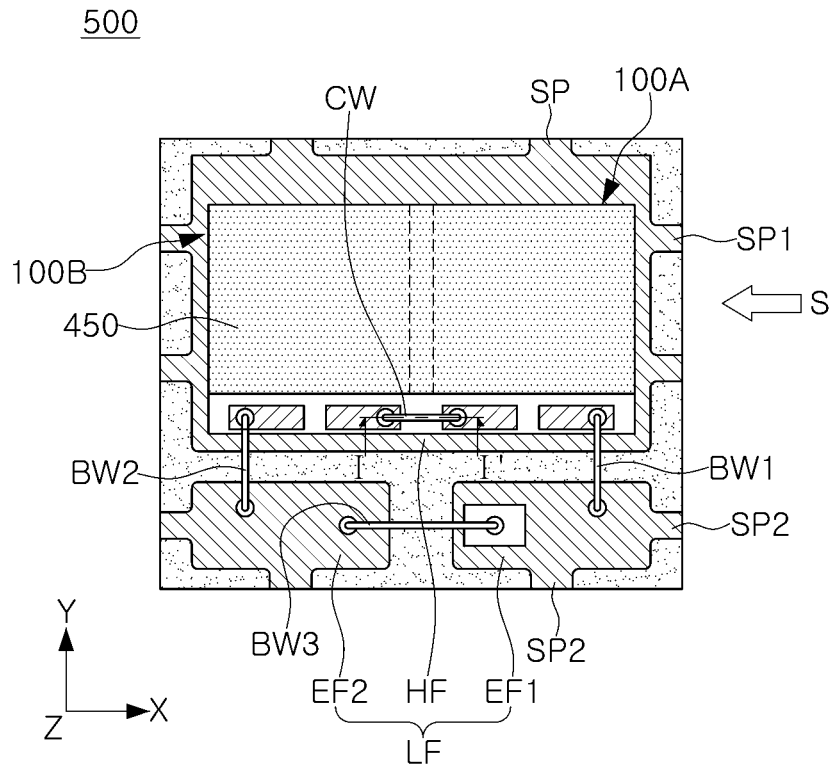
FIG. 2A is a plan diagram illustrating the light emitting device package illustrated in FIG. 1.
Figure 2B:
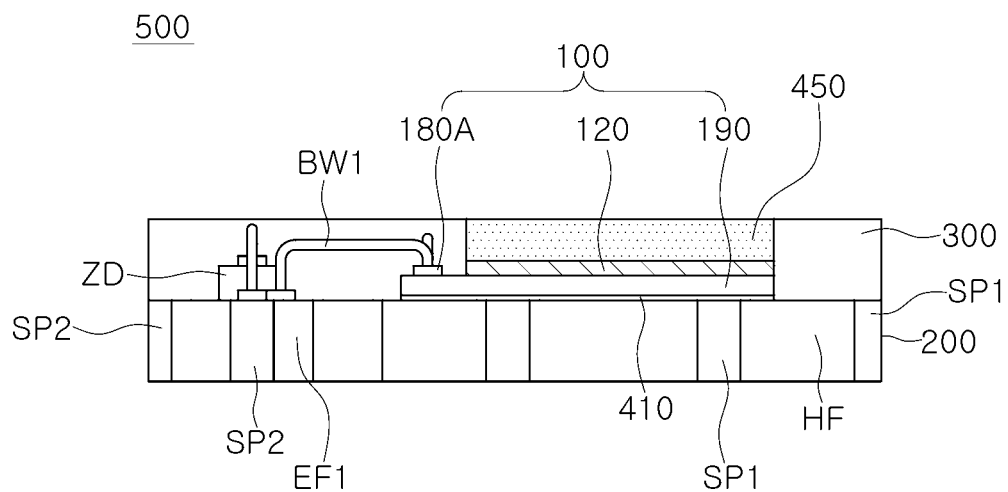
FIG. 2B is a lateral diagram illustrating the light emitting device package illustrated in FIG. 1.

FIG. 1 is a perspective diagram illustrating a light emitting device package according to an example embodiment. FIGS. 2A and 2B are a plan diagram and a lateral diagram illustrating the light emitting device package illustrated in FIG. 1, respectively.

Referring to FIGS. 2A and 2B along with FIG. 1, a light emitting device package 500 in the example embodiment may include a first molding member 200 (e.g., a first molding) surrounding a lead frame LF, a first semiconductor light emitting device 100A and a second semiconductor light emitting device 100B disposed on the lead frame LF, a wavelength conversion layer 450 disposed on the first semiconductor light emitting device 100A and the second semiconductor light emitting device 100B, and a second molding member 300 (e.g., a second molding) disposed on the first molding member 200 and surrounding the first semiconductor light emitting device 100A and the second semiconductor light emitting device 100B. The lead frame LF and the first molding member 200 surrounding the lead frame LF may be provided as a package substrate of the light emitting device package 500.

The lead frame LF employed in the example embodiment may include a heat dissipation frame HF in which the first semiconductor light emitting device 100A and the second semiconductor light emitting device 100B are disposed, and a first electrode frame EF1 and a second electrode frame EF2 arranged adjacent to one side of the heat dissipation frame HF.

For example, the lead frame LF may include a metal material having electrical conductivity, such as copper (Cu). In example embodiments, an external surface of the lead frame LF may be plated. For example, upper and lower surfaces of the lead frame LF may be plated with a material such as silver (Ag) or gold (Au).

The heat dissipation frame HF, the first electrode frame EF1, and the second electrode frame EF2 may be physically separated from each other by the first molding member 200. The heat dissipation frame HF may dissipate heat generated from the first semiconductor light emitting device 100A and the second semiconductor light emitting device 100B. Since the heat dissipation frame HF includes a metal material having relatively excellent thermal conductivity, the heat dissipation frame HF may function as an effective heat dissipation means.

A thermal conductive bonding layer 410 may be disposed between the first semiconductor light emitting device 100A and the second semiconductor light emitting device 100B and the heat dissipation frame HF. The first semiconductor light emitting device 100A and the second semiconductor light emitting device 100B may be fixed by being stably supported by the heat dissipation frame HF by the thermal conductive bonding layer 410. For example, the thermal conductive bonding layer 410 may include a eutectic alloy. Since a contact area between the heat dissipation frame HF and the first semiconductor light emitting device 100A and the second semiconductor light emitting device 100B is wide and a heat dissipation area is expanded by the heat dissipation frame HF, heat dissipation efficiency may improve.

The heat dissipation frame HF may have an area larger than areas of the first electrode frame EF1, and the second electrode frame EF2. As in the example embodiment, the heat dissipation frame HF, the first electrode frame EF1, and the second electrode frame EF2 may be provided as separate elements. In example embodiments, one of the first electrode frame EF1 and the second electrode frame EF2 may be configured to be integrated with the heat dissipation frame HF.

The first electrode frame EF1 and the second electrode frame EF2 may provide power to the first semiconductor light emitting device 100A and the second semiconductor light emitting device 100B. The first electrode frame EF1 and the second electrode frame EF2 may be disposed parallel to one side of the heat dissipation frame HF and may be connected to the first semiconductor light emitting device 100A and the second semiconductor light emitting device 100B, respectively.

In the example embodiment, each of the first semiconductor light emitting device 100A and the second semiconductor light emitting device 100B may include a semiconductor light emitting structure 120 configured to emit light having a specific wavelength. In the example embodiment, each of the first semiconductor light emitting device 100A and the second semiconductor light emitting device 100B may include a substrate 190. A lower surface of each substrate 190 may be bonded to the heat dissipation frame HF by a thermal conductive bonding layer 410. Each substrate 190 may have an upper surface divided into a first area adjacent to the one side of the heat dissipation frame HF and a second area other than the first area. The semiconductor light emitting structure 120 may be disposed in the second area of each substrate 190, and a first pad 180A and a second pad 180B may be disposed in the first areas of the plurality of the substrate 190, respectively. The first pad 180A and the second pad 180B may be configured to apply a predetermined voltage to the semiconductor light emitting structure 120. The first semiconductor light emitting device 100A and the second semiconductor light emitting device 100B will be described in greater detail later (see FIGS. 4 and 5).

The first pad 180A and the second pad 180B may be disposed along sides of the substrate 190 adjacent to the first electrode frame EF1 and the second electrode frame EF2. The first pad 180A of the first semiconductor light emitting device 100A may be connected to the first electrode frame EF1 by a first bonding wire BW1. The second pad 180B of the second semiconductor light emitting device 100B may be connected to the second electrode frame EF2 by a second bonding wire BW2.

In the example embodiment, the first semiconductor light emitting device 100A and the second semiconductor light emitting device 100B pray be directly connected to each other by an ter-chip bonding wire CW. The inter-chip bonding wire CW may connect the second pad 180B of the first semiconductor light emitting device 100A to the first pad. 180A of the second semiconductor light emitting device 100B.

A Zener diode ZD may be disposed in one of the first electrode frame EF1 and the second electrode frame EF2. For example, the Zener diode ZD may be disposed on the first electrode frame EF1. In this case, the Zener diode ZD and the second electrode frame EF2 may be electrically connected by a third bonding wire BW3.

The Zener diode ZD may prevent an overcurrent and/or an applied voltage electrostatic discharge (ESD) flowing in the first semiconductor light emitting device 100A and the second semiconductor light emitting device 100B. Also, an adhesive layer (not illustrated) may be disposed between the Zener diode ZD and the first electrode frame EF1. The adhesive layer may adhere the Zener diode ZD to the first electrode frame EF1, and mays include a conductive paste or a eutectic metal. In other example embodiments, the light emitting device package 500 may not include the Zener diode ZD, and in this case, the third bonding wire BW3 may also not be provided.

Figure 3:
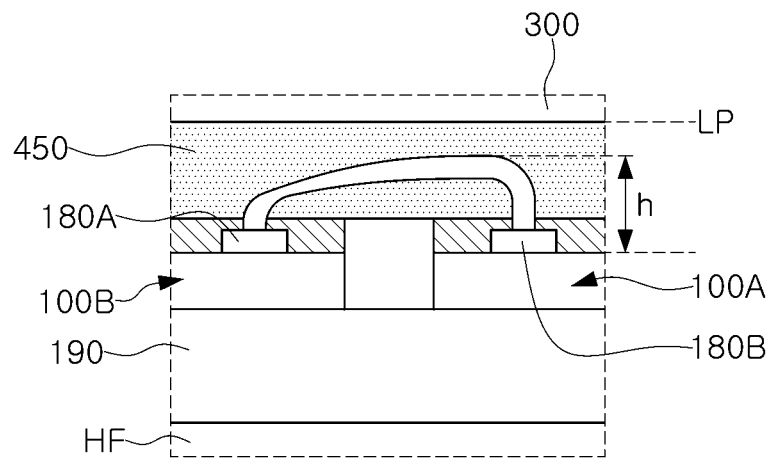
FIG. 3 is a cross-sectional diagram illustrating the emitting device package illustrated in FIG. 2A taken along line I-I'.

An uppermost height (a vertex of a roof height) of the first to third bonding wires BW1-BW3 may be configured to be lower than a level LP of an upper surface of the wavelength conversion layer 450. Accordingly, the first to third bonding wires BW1-BW3 may not be exposed from the second molding member 300. Similarly, as illustrated in FIG. 3, an uppermost height h of the inter-chip bonding wire CW disposed on a level higher than a level of the first electrode frame EF1 and the second electrode frame EF2 may also be configured to be lower than the level LP of the upper surface of the wavelength conversion layer 450. In the example embodiment, since the inter-chip bonding wire CW is disposed on the upper surface of the substrate 190, a relatively high level, the inter-chip bonding wire CW may be disposed to be lower than a height of a general wire.

For example, a material forming the first to third bonding wires BW1, BW2, and BW3 and the inter-chip bonding wire CW may include at least one of gold (Au), silver (Ag), copper (Cu), lead (Pb), tin (Sn), and aluminum (Al). In example embodiments, the bonding wires may also be formed by one of a thermo-compression bonding process or an ultrasonic bonding process, or a thermo sonic bonding process obtained by mixing a thermo-compression bonding method and an ultrasonic connection method.

For ease of description, the first molding member 200 and the second molding member 300 are illustrated to be translucent or transparent such that internal configurations thereof may be visible, but the elements may have an opaque structure (e.g., a reflective white structure).

The first molding member 200 may be formed to surround the heat dissipation frame HF, the first electrode frame EF1, and the second electrode frame EF2. The first electrode frame EF1 and the second electrode frame EF2 may be electrically separated from each other by the first molding member 200.

The heat dissipation frame HF may include at least one first protrusion SP1 partially exposed on a side surface of the first molding member 200. Similarly, the first electrode frame EF1 and the second electrode frame EF2 may include at least one second protrusion SP2 partially exposed on a side surface of the first molding member 200. The first protrusion SP1 and the second protrusion SP2 may be based on a method of manufacturing a light emitting device package (see FIG. 13A).

For example, the first molding member 200 may include an epoxy material, a thermosetting material, a thermoplastic material, and/or a UV treatment material. In example embodiments, the first molding member 200 may include an epoxy molding compound (EMC).

The first molding member 200 may have a plate shape having planar upper and lower surfaces. The upper and lower surfaces of the lead frame LF may be exposed through the upper and lower surfaces of the first molding member 200, respectively. In example embodiments, an upper surface of the first molding member 200 and an upper surface of the lead frame LF may be disposed on the same plane, and the lower surface of the first molding member 200 and the lower surface of the lead frame LF may be disposed on the same plane. In other words, the first molding member 200 and the lead frame LF may have the same thickness.

The wavelength conversion layer 450 may be disposed on upper surfaces of the first semiconductor light emitting device 100A and the second semiconductor light emitting device 100B. The wavelength conversion layer 450 may include a wavelength conversion material such as a phosphor or a quantum dot which may convert light emitted from the semiconductor light emitting structure 120 into light of a different wavelength, and the wavelength conversion layer 450 may have a plate shape. In example embodiments, the wavelength conversion layer 450 may be a resin material including a wavelength conversion material. For example, the resin may be a silicone resin, an epoxy resin, or a resin mixture thereof. In another example embodiment, the wavelength conversion layer 450 may be provided as a film formed of a ceramic phosphor sintered material.

The wavelength conversion layer 450 may include two or more types of materials which may convert light to have different wavelengths. The wavelength conversion layer 450 may convert light generated by the first semiconductor light emitting device 100A and the second semiconductor light emitting device 100B into white light or light having a specific wavelength and may emit the light. For example, the wavelength conversion layer 450 may include a green phosphor and a red phosphor to emit white light as final light. In example embodiments, the wavelength conversion layer 450 may have a structure in which a plurality of wavelength conversion layers (e.g., a resin layer including phosphor and/or a ceramic phosphor film) are stacked.

Figure 5:
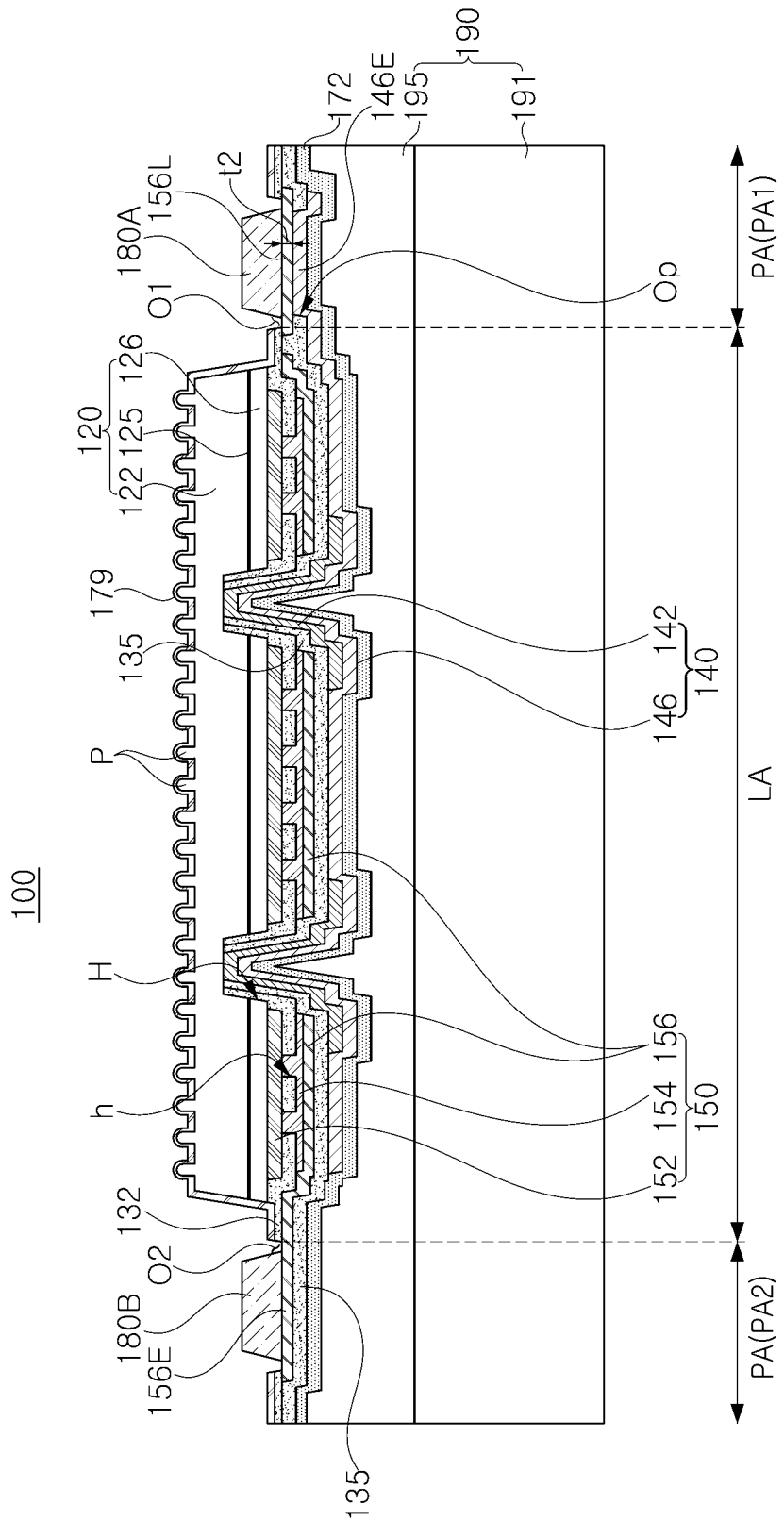
FIG. 5 is a lateral diagram illustrating the semiconductor light emitting device of FIG. 4, according to the example embodiment of the present disclosure.
Figure 6:
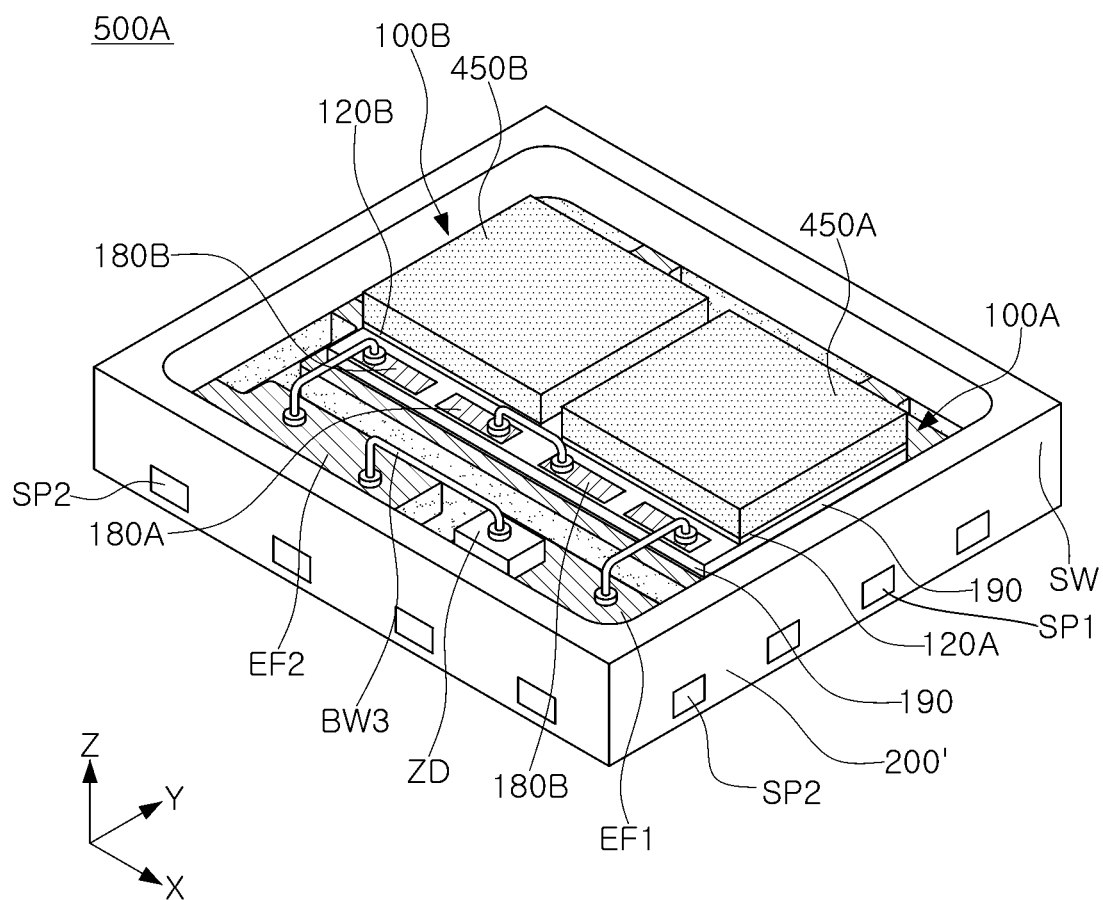
FIG. 6 is a perspective diagram illustrating a light emitting device package according to an example embodiment of the present disclosure.
Figure 8:
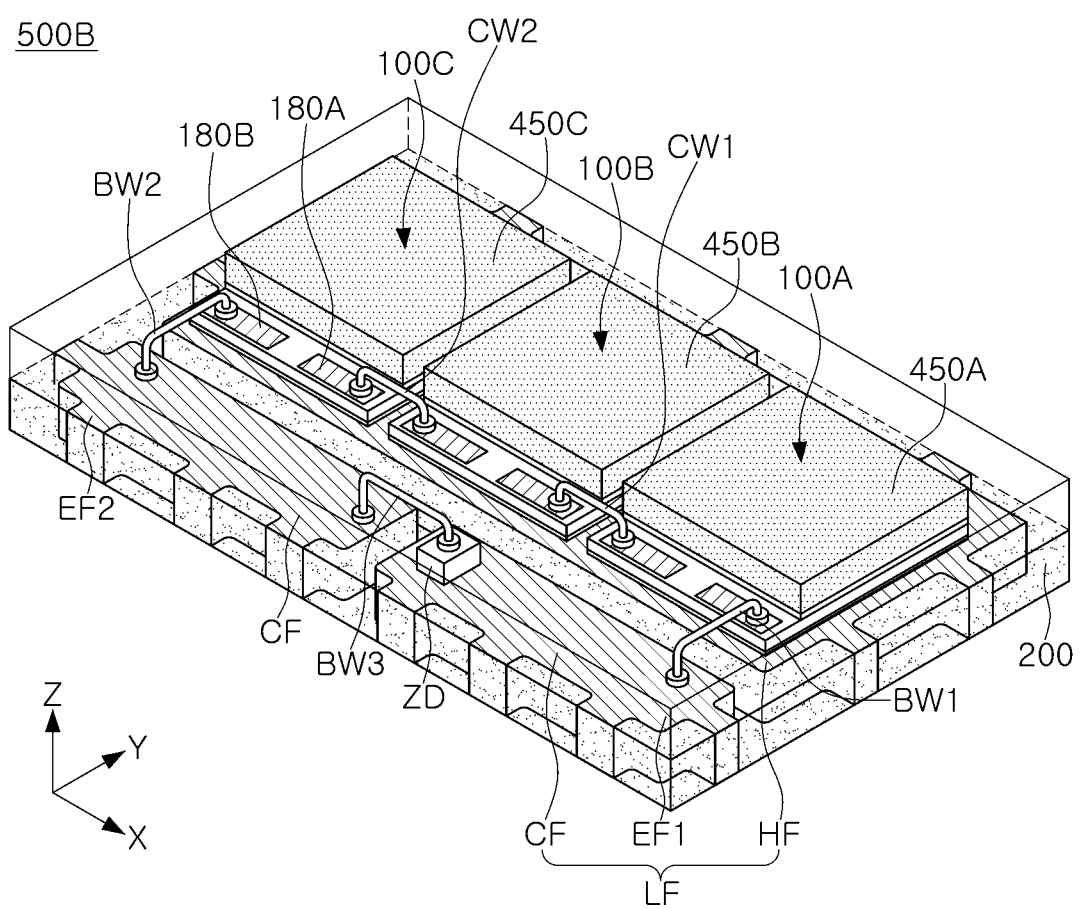
FIG. 8 is a perspective diagram illustrating a light emitting device package according to an example embodiment of the present disclosure.

In the example embodiment, it is illustrated that a single one of the wavelength conversion layer 450 may be disposed on the upper surfaces of the first semiconductor light emitting device 100A and the second semiconductor light emitting device 100B, but an example embodiment thereof is not limited thereto, and the wavelength conversion layer 450 may be provided as an individual wavelength conversion layer according to the number of semiconductor light emitting devices (see FIGS. 5, 6, and 8). The wavelength conversion layer 450 may have an area larger than an arrangement area of the first semiconductor light emitting device 100A and the second semiconductor light emitting device 100B, and may be disposed to cover the first semiconductor light emitting device 100A and the second semiconductor light emitting device 100B. Side surfaces of the wavelength conversion layer 450 may be on a same plane as those of side surfaces of the first semiconductor light emitting device 100A and the second semiconductor light emitting device 100B. Accordingly, as illustrated in FIG. 2A, when the light emitting device package 500 is viewed from above, only the wavelength conversion layer 450 may be exposed from the second molding member 300. In other words, the upper surface of the wavelength conversion layer 450 may be exposed from the second molding member 300, and the side surfaces of the first semiconductor light emitting device 100A and the second semiconductor light emitting device 100B and the side surfaces of the wavelength conversion layer 450 may not be exposed from the second molding member 300.

As described above, the second molding member 300 may be formed on the first molding member 200 and the lead frame LF to surround the first semiconductor light emitting device 100A and the second semiconductor light emitting device 100B and the first to third bonding wires BW1-BW3 and the interchip bonding wire CW. In example embodiments, instead of the wavelength conversion layer 450, the second molding member 300 may be provided with a wavelength conversion structure in which a wavelength conversion material such as a phosphor is dispersed. In the example embodiment, side surfaces and an upper surface of the second molding member 300 may have a right-angled shape (e.g., a rectangular parallelepiped). The second molding member 300 may protect the first semiconductor light emitting device 100A and the second semiconductor light emitting device 100B and the first to third bonding wires BW1-BW3 and the interchip bonding wire CW from external influences such as contamination and impact. To this end, the second molding member 300 may have a thickness sufficient to surround at least both the first semiconductor light emitting device 100A and the second semiconductor light emitting device 100B. In the example embodiment, the second molding member 300 may have a thickness corresponding to an entire thickness of the first semiconductor light emitting device 100A and the second semiconductor light emitting device 100B and the wavelength conversion layer 560, and the wavelength conversion layer 560 may have an upper surface substantially coplanar with the upper surface of the second molding member 300. Also, the second molding member 300 may cover an overall area of the first molding member 200, and a width and a length of the second molding member 300 may be substantially equal to a width and a length of the first molding member 200, respectively.

The first molding member 200 may include a resin including highly reflective powder. For example, the highly reflective powder may be white ceramic powder such as $TiO_2$, and the resin may include epoxy, silicone, and a combination thereof. Similarly to the first molding member 200, the second molding member 300 may include a resin including highly reflective powder. At least one of the first molding member 200 and the second molding member 300 may be formed by injection molding or transfer molding.

The light emitting device package 500 according to the example embodiment may improve extraction efficiency of light emitted from the first semiconductor light emitting device 100A and the second semiconductor light emitting device 100B using the wavelength conversion layer 450 exposed from the second molding member 300, and may also effectively emit heat generated from the semiconductor light emitting device 100 externally from the light emitting device package 500 through a thermal conductive pad and the lead frame LF. Also, in a multi-chip package having the first semiconductor light emitting device 100A and the second semiconductor light emitting device 100B, the first semiconductor light emitting device 100A and the second semiconductor light emitting device 100B may be directly connected using a wire without employing an element for connecting chips to each other, such as an electrodeless frame CF (see FIG. 9), such that defects caused by the electrodeless frame CF may be prevented in the process of forming the first molding member 200 (see FIGS. 13A and 13B).

Figure 4:
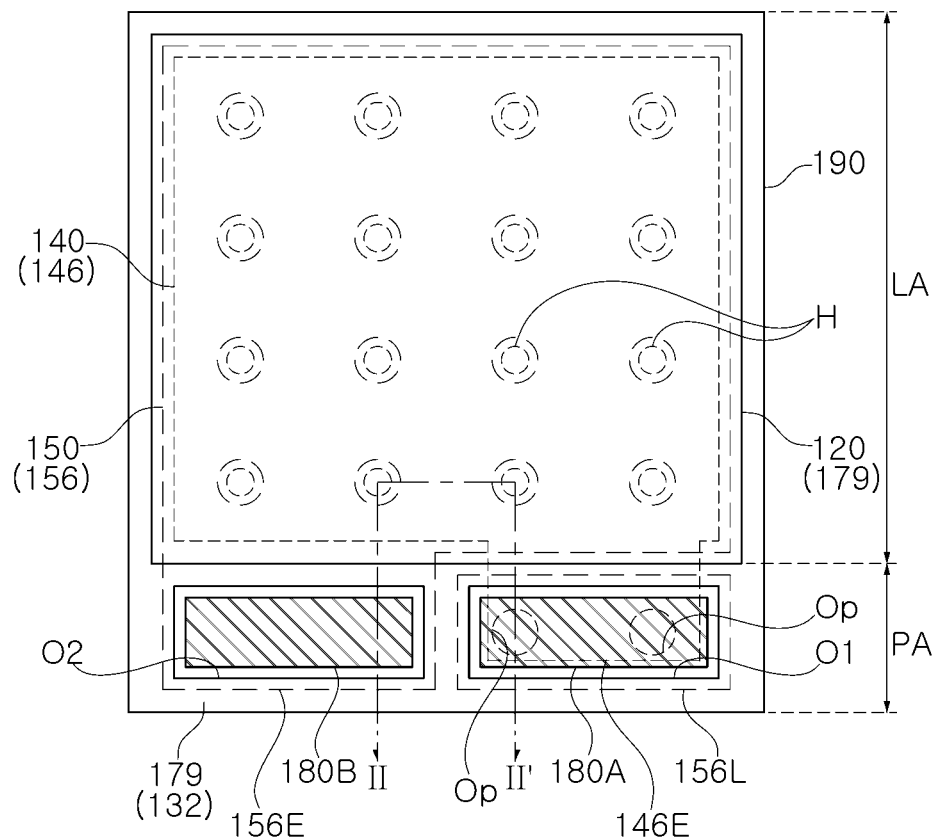
FIG. 4 is a plan diagram illustrating a semiconductor light emitting device employable in a light emitting device package, according to an example embodiment of the present disclosure.

FIG. 4 is a plan diagram illustrating a semiconductor light emitting device employable in a light emitting device package. FIG. 5 is a cross-sectional diagram illustrating the semiconductor light emitting device in FIG. 4 taken along line II-II'.

Referring to FIGS. 4 and 5, in the semiconductor light emitting device 100 according to the example embodiment, a specific structure of the first semiconductor light emitting device 100A and the second semiconductor light emitting device 100B is illustrated, and the semiconductor light emitting device 100 may include a substrate 190 having an upper surface divided into a light emitting area LA and a pad area PA, a semiconductor light emitting structure 120 disposed in the light emitting area LA of the substrate 190, and a first pad 180A and a second pad 180B disposed in the pad area PA of the substrate 190.

Also, the semiconductor light emitting device 100 may further include a wiring structure for connecting the first pad 180A and the second pad 180B to the semiconductor light emitting structure 120. The wiring structure a include a first electrode layer 140 disposed between the semiconductor light emitting structure 120 and the substrate 190, a second electrode layer 151) disposed between the first electrode layer 140 and the semiconductor light emitting structure 120, and an interlayer insulating layer 135 disposed between the first electrode layer 140 and the second electrode layer 150.

The substrate 190 may be configured to be electrically insulated from the semiconductor light emitting structure 120. In example embodiments, even when the substrate 190 is a conductive structure, the substrate 190 may include an insulating separation structure to not be connected to the first electrode layer 140 or the second electrode layer 150. In the example embodiment, the semiconductor light emitting device 100 may include an insulating separation layer 172 disposed on a surface of a wiring structure opposing the substrate 190. The insulating separation layer 172 may be disposed on the interlayer insulating layer 135 to cover the first electrode layer 140.

In the example embodiment, the substrate 190 may include a support substrate 191 and a bonding metal layer 195. For example, the support substrate 191 may be a conductive substrate such as a silicon (Si) substrate, and the bonding metal layer 195 may be a bonding metal such as Au, Sn, Ni, Au—Sn, Ni—Sn, or Ni—Au—Sn. In another example embodiment, the substrate 190 may be formed by a plating process, and even in this case, the substrate 190 may be electrically insulated from the first electrode layer 140 and the second electrode layer 150 by the insulating separation layer 172.

Referring to FIG. 5, the semiconductor light emitting structure 120 may include a first conductivity-type semiconductor layer 122, an active layer 125, and a second conductivity-type semiconductor layer 126, disposed in order on the light emitting area. LA of the substrate 190.

For example, the first conductivity-type semiconductor layer 122 may include a nitride semiconductor satisfying n-type $In_xAl_yGa_{1-x-y}N$ ($0 \leq x<1$, $0 \leq y<1$, $0 \leq x+y<1$), and the n-type impurity may be Si. For example, the first conductivity-type semiconductor layer 122 may include an n-type GaN layer. The second conductivity-type semiconductor layer 126 may be a nitride semiconductor layer satisfying p-type $In_xAl_yGa_{1-x-y}N$ ($0 \leq y<1$, $0 \leq y<1$, $0 \leq x+y<1$), and the p-type impurity may be Mg. In example embodiments, the second conductivity-type semiconductor layer 126 may be implemented in a single-layer structure, but in other example embodiments, the second conductivity-type semiconductor layer 126 may have a multilayer structure having layers of different compositions. The active layer 125 may have a multiple quantum well (MQW) structure in which a quantum well layer and a quantum barrier layer are alternately stacked. For example, the quantum well layer and the quantum barrier layer may be $In_xAl_yGa_{1-x-y}N$ ($0 \leq x \leq 1$, $0 \leq y \leq 1$, $0 \leq x+y \leq 1$) having different compositions. In an example, the quantum well layer may be $In_xGa_{1-x}N$ ($0<x \leq 1$), and the quantum barrier layer may be GaN or AlGaN.

In the example embodiment, the semiconductor light emitting structure 120 may include a plurality of holes H that extend into the first conductivity-type semiconductor layer 122 through the second conductivity-type semiconductor layer 126 and the active layer 125. The first electrode layer 140 may connect to the first conductivity-type semiconductor layer 122 through the plurality of holes H and may be provided on a same surface as the surface on which the second electrode layer 150 is formed.

The first electrode layer 140 and the second electrode layer 150 employed in the example embodiment may be disposed to overlap on different levels between the semiconductor light emitting structure 120 and the substrate 190. Even when partial areas of the first electrode layer 140 and the second electrode layer 150 overlap, the first electrode layer 140 and the second electrode layer 150 may be insulated from each other by the interlayer insulating layer 135.

The first electrode layer 140 may be connected to the first conductivity-type semiconductor layer 122 through the plurality of holes H, and may have a first extended electrode portion 146E extending onto a first area PA1. The second electrode layer 150 may be connected to the second conductivity-type semiconductor layer 126 and may have a second extended electrode portion 156E extending onto a second area PA2. The interlayer insulating layer 135 may be disposed between the first electrode layer 140 and the second electrode layer 150 and may extend to the pad area PA.

In example embodiments, a leveling electrode layer 156L may be provided on the first extended electrode portion 146E to reduce a level between the first extended electrode portion 146E and the second extended electrode portion 156E. The interlayer insulating layer 135 may have an opening Op through which one area of the first extended electrode portion 146E is provided. The leveling electrode layer 156L may be disposed on the interlayer insulating layer 135 disposed in one area of the pad area PA and may be separated from the first electrode layer 140. The leveling electrode layer 156L may be connected to the one area of the first extended electrode portion 146E through the opening Op.

The first pad 180A and the second pad 180B may be disposed on the leveling electrode layer 156L and the second extended electrode portion 156E, respectively. Accordingly, by reducing a level difference using the leveling electrode layer 156L, a process of selectively etching the semiconductor light emitting structure 120 to expose the first pad 180A and the second pad 180B may be easily performed.

At least one of the first electrode layer 140 and the second electrode layer 150 may include a plurality, electrode layers. In the example embodiment, the first electrode layer 140 may include a first contact electrode 142 connected to the first conductivity-type semiconductor layer 122 through the plurality of holes H, and a first connection electrode 146 disposed on the first contact electrode 142 and providing the first extended electrode portion 146E.

The first pad 180A and the second pad 180B may be disposed in an area adjacent to one side of the substrate 190, that is, disposed side by side in the pad area PA, and as illustrated in FIG. 2A, the first semiconductor light emitting device 100A and the second semiconductor light emitting device 100B may be disposed on the heat dissipation frame HF to be disposed adjacent to the first electrode frame EF1 and the second electrode frame EF2, respectively, in the light emitting device package 500.

The second electrode layer 150 may include a second contact electrode 152 connected to the second conductivity-type semiconductor layer 126, and a second connection electrode 156 disposed on the second contact electrode 152 and providing the second extended electrode portion 156E. Also, in the example embodiment, the semiconductor light emitting device 100 may further include an insulating film 132 disposed between the second contact electrode 152 and the second connection electrode 156 and having a plurality of openings h. The second electrode layer 150 may further include an interconnection electrode 154 configured to connect the second contact electrode 152 to the second connection electrode 156 through the plurality of openings h.

The first contact electrode 142 may be a transparent electrode layer. For example, the first contact electrode 142 may include at least one material selected from among indium tin oxide (ITO), zinc-doped indium tin oxide (ZITO), zinc indium oxide (ZIO), gallium indium oxide (GTO), zinc tinoxide (ZTO), fluorine-doped tin oxide (FTO), aluminium-doped zinc oxide (AZO), gallium-doped zinc oxide (GZO), $In_4Sn_3O_{12}$, and $Zn_{(1-x)}Mg_xO$ (zinc magnesium oxide, $0 \le x \le 1$). The thickness of the first contact electrode 142 may be in the range of 1 to 5 nm, although not limited thereto. For example, the interconnection electrode 154 and the second contact electrode 152 may include at least one material among Ag, Al, Ni, Cr, Cu, Au, Pd, Pt, Sn, W, Rh, Ir, Ru, Mg, Zn, and alloys thereof. For example, the first connection electrode 146 and the second connection electrode 156 may include at least one material among Al, Au, W, Pt, Si, Ir, Ag, Cu, Ni, Ti, Cr, and alloys thereof.

In the example embodiment, the leveling electrode layer 156L may be formed together with the second connection electrode 156 for the second extended electrode portion 156E. For example, the leveling electrode layer 156L may include the same electrode material as that of the second connection electrode 156, that is, the second extended electrode portion 156E. Also, the leveling electrode layer 156L may have the same thickness as that of the second extended electrode portion 156E.

A portion of the insulating film 132 may extend onto the pad area PA of the substrate 190, and may include a first opening O1 and a second opening O2 for exposing the leveling electrode layer 156L and the second extended electrode portion 156E, respectively. In the example embodiment, the number of each of the first pad 180A and the second pad 180B may be one, but at least one of the first pad 180A and the second pad 180B may be provided as a plurality of pads. Also, the first opening O1 and the second opening O2 of the insulating film 132 may be formed according to the number of the first pad 180A and the second pad 180B, but in another example embodiment, the opening for pads arranged adjacent to one side, such as the first pad 180A and the second pad 180B, may be provided as a single opening.

In the example embodiment, the upper surface of the semiconductor light emitting structure 120, that is the upper surface of the first conductivity-type semiconductor layer 122, may have unevenness (P) to improve light extraction efficiency. Also, the semiconductor light emitting device 100 may include a passivation layer 179 disposed on a surface of the semiconductor light emitting structure 120 and the insulating film 132 disposed in the pad area PA.

Figure 7:
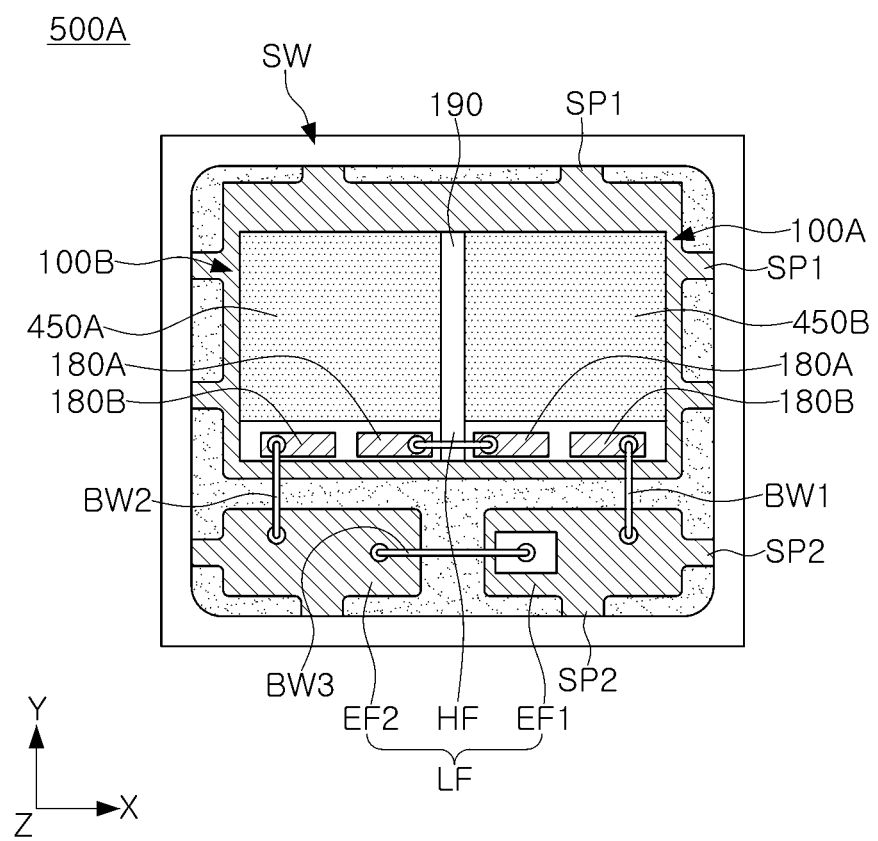
FIG. 7 is a plan diagram illustrating the light emitting device package of FIG. 6 according to the example embodiment of the present disclosure.

FIGS. 6 and 7 are a perspective diagram and a plan diagram illustrating a light emitting device package according to an example embodiment, respectively.

Referring to FIGS. 6 and 7, a light emitting device package 500A according to the example embodiment may be similar to the light emitting device package 500 illustrated in FIGS. 1, 2A, and 2B other than a configuration in which the first semiconductor light emitting device 100A and the second semiconductor light emitting device 100B may be implemented on a single one of the substrate 190, a configuration in which the first wavelength conversion layer 450A and the second wavelength conversion layer 450B may be separated from each other, and a configuration in which a structure of a first molding member may be different. Also, the elements in the example embodiment may be the same as or similar to the elements of the light emitting device package 500 described with reference to FIGS. 1, 2A, and 2B unless otherwise specified.

In the example embodiment, the first semiconductor light emitting device 100A and the second semiconductor light emitting device 100B may share a single one of the substrate 190. For example, the first semiconductor light emitting structure 120A and the second semiconductor light emitting structure 120B may be separated from each other and may, be disposed on the single one of the substrate 190. Each of the first semiconductor light emitting structure 120A and the second semiconductor light emitting structure 120B may have a wiring structure (see FIGS. 4 and 5), and the first semiconductor light emitting structure 120A and the second semiconductor light emitting structure 120B may each include a first pad 180A and a second pad 180B connected to the wiring structure. The first pad 180A and the second pad 180B of the first semiconductor light emitting device 100A and the second semiconductor light emitting device 100B may be alternately disposed and disposed side by side on an area of the substrate 190 that is adjacent to the first electrode frame EF1 and the second electrode frame EF2.

The first wavelength conversion layer 450A and the second wavelength conversion layer 450B may be configured separately, and may be disposed on upper surfaces of the first semiconductor light emitting device 100A and the second semiconductor light emitting device 100B, respectively. The first wavelength conversion layer 450A and the second wavelength conversion layer 450B may have a sufficient area to cover upper surfaces of the first semiconductor light emitting device 100A and the second semiconductor light emitting device 100B.

Also, the first molding member 200' employed in the example embodiment may have a sidewall structure SW protruding along an edge of a planar structure as in the aforementioned example embodiment. The sidewall structure SW may have a structure surrounding the heat dissipation frame HF in which the first semiconductor light emitting device 100A and the second semiconductor light emitting device 100B are disposed, and the first electrode frame EF1 and the second electrode frame EF2. The sidewall structure SW may be formed to partially cover an upper surface of the heat dissipation frame HF and an upper surface of the first electrode frame EF1 and the second electrode frame EF2.

FIG. 8 is a perspective diagram illustrating a light emitting device package according to an example embodiment.

Referring to FIG. 8, a light emitting device package 500S according to the example embodiment may be similar to the light emitting device package 500 illustrated in FIGS. 1, 2A, and 2B other than a changed configuration of the structure of the lead frame LF and a configuration in which first to third wavelength conversion layers 450A, 450B, and 450C are included in the light emitting device package 500B and are separated from each other. Also, the elements in the example embodiment may be understood with reference to the description of the same or similar elements of the light emitting device package 500 described with reference to FIGS. 1, 2A, and 2B unless otherwise specified.

The light emitting device package 500B according to the example embodiment may include a lead frame LF surrounded by a first molding member 200, and first to third semiconductor light emitting devices 100A, 100B, and 1000 surrounded by a second molding member 300 and disposed on the lead frame LF.

The lead frame LF may include a heat dissipation frame HF in which the first to third semiconductor light emitting devices 100A, 100B, and 100C are disposed, and a first electrode frame EF1 and a second electrode frame EF2 arranged adjacent to one side of the heat dissipation frame HF.

The first pad 180A of the first semiconductor light emitting

A may be connected to the first electrode frame EF1 by a first bonding wire BW1, and the second pad 180B of the third semiconductor light emitting device 1000 may be connected to the second electrode frame EF2 by a second bonding wire BW2. A Zener diode ZD may be electrically connected to the second electrode frame EH, by the third bonding wire BW3.

In the example embodiment, the first semiconductor light emitting device 100A and the second semiconductor light emitting device 100B and the second semiconductor light emitting device 100B and the third semiconductor light emitting device 1000 may be directly connected to each other by the first inter-chip bonding wire CW1 and the second inter-chip bonding wire CW2, respectively. The first inter-chip bonding wire CW1 may connect the second pad 180B of the first semiconductor light emitting device 100A to the first pad 180A of the second semiconductor light emitting device 100B, and similarly to this configuration, the second inter-chip bonding wire CW2 may connect the second pad 180E of the second semiconductor light emitting device 100B to the first pad 180A of the third semiconductor light emitting device 100C. Also, a greatest height of the first inter-chip bonding wire CW1 and the second inter-chip bonding wire CW2 may be positioned lower than a level of the upper surface of the first to third wavelength conversion layers 450A, 450B, and 450C.

The first to third semiconductor light emitting devices 100A, 100B, and 100C may be arranged side by side in one direction (x direction) on the heat dissipation frame HF. The heat dissipation frame HF may have an area larger than each area of the first electrode frame EF1 and the second electrode frame EF2. In example embodiments, the heat dissipation frame HF may be separated similarly to the the first electrode frame EF1 and the second electrode frame EF2 and may be provided as a plurality of heat dissipation frames.

The first to third wavelength conversion layers 450A, 450B, and 450C may be separately disposed on upper surfaces of the first to third semiconductor light emitting devices 100A, 100B, and 100C. The first to third wavelength conversion layers 450A, 450B, and 450C may have a sufficient area to cover upper surfaces of the first to third semiconductor light emitting devices 100A, 100B, and 1000.

Although the light emitting device package according to the aforementioned example embodiments is illustrated in a structure in which an electrodeless frame for inter-chip connection is not provided, in the example embodiment, even when inter-chip connection is implemented using an electrodeless frame, a reinforcing molding material may be provided to prevent defects caused by distortion of an electrodeless frame in an injection molding process (see FIGS. 9 to 13D).

Figure 9:
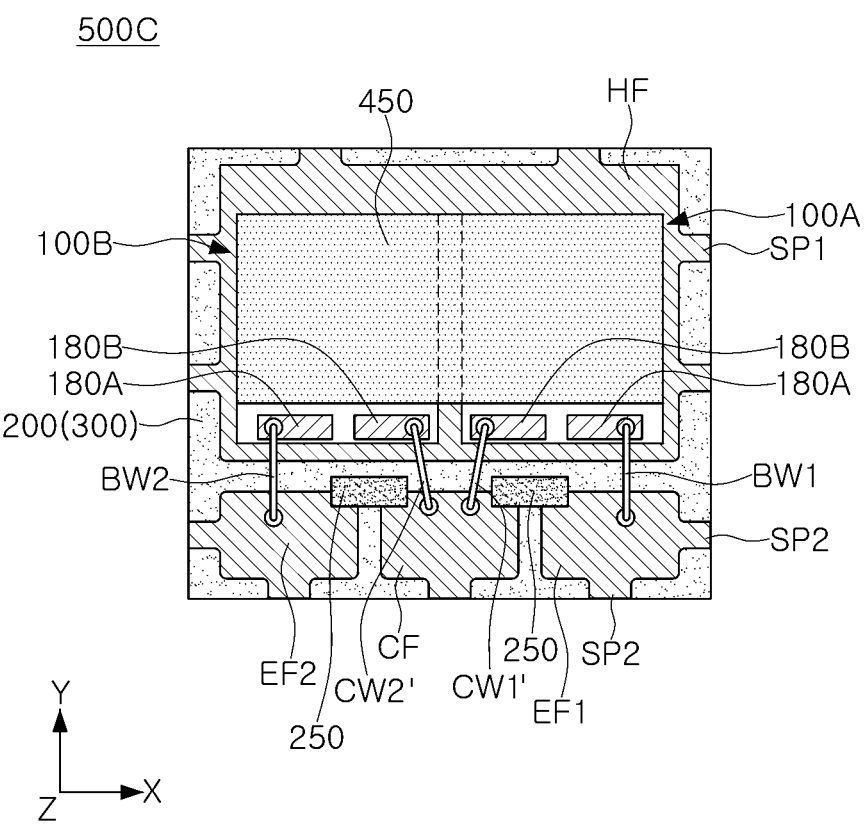
FIG. 9 is a plan diagram illustrating a light emitting device package according to an example embodiment of the present disclosure.

FIG. 9 is a plan diagram illustrating a light emitting device package according to an example embodiment.

Referring to FIG. 9, a light emitting device package 500C according to the example embodiment may be similar to the light emitting device package 500 illustrated in FIGS. 1, 2A, and 2B other than a configuration in which the electrodeless frame CF is provided for inter-chip connection between the first electrode frame EF1 and the second electrode frame EF2, and a configuration in which a reinforcing molding member 250 for the electrodeless frame CF is provided. Also, the elements in the example embodiment may be understood with reference to the description of the same or similar elements of the light emitting device package 500 described with reference to FIGS. 1, 2A, and 2B unless otherwise specified.

The lead frame LF employed in the example embodiment may include a heat dissipation frame HF, a first electrode frame EF1 and a second electrode frame EF2 arranged adjacent to one side of the heat dissipation frame HF, and an electrodeless frame CF disposed between the second electrode frames EF1 and EF2. The lead frame LF may be surrounded by the first molding member 200. Similarly to the aforementioned embodiments, the upper and lower surfaces of the lead frame LF may be exposed on the upper and lower surfaces of the first molding member 200, respectively.

In a process of forming the first molding member 200, since support of the electrodeless frame CF may be weaker than that of the heat dissipation frame HF and the first electrode frame EF1 and the second electrode frame EF2, the reinforcing molding member 250 for the electrodeless frame CF may be provided in the example embodiment.

Specifically, each of the heat dissipation frame HF and the first electrode flame EF1 and the second electrode frame EF2 may have a plurality of protrusions (e.g., a plurality of a first protrusion SP1 or a plurality of a second protrusion SP2) arranged throughout at least two sides. The first protrusion SP1 and the second protrusion SP2 may be understood as a portion of a connection portion CP supporting the respective frame element in the process of forming the first molding member 200 illustrated in FIGS. 13A and 13B. Differently from the heat dissipation frame HF and the first electrode frame EF1 and the second electrode frame EF2, in the electrodeless frame CF, a protrusion or a connection mm be only disposed on one side or the number of the employed frame may be limited, such that the electrodeless frame CF may not be stably supported in the process of forming the first molding member 200. In the example embodiment, the reinforcing molding member 250 may stably support the electrodeless frame CF without any distortion during the molding process.

In the example embodiment, the reinforcing molding member 250 may be disposed on the first molding member 200 and may extend to one region of the first electrode frame EF1 and the second electrode frame EF2 adjacent to one area of the electrodeless frame CF. A plurality of the reinforcing molding member 250 may be disposed. In the example embodiment, two of the reinforcing molding member 250 may be disposed throughout partial areas disposed on opposite sides of the electrodeless frame CF and partial areas adjacent to the first electrode frame EF1 and the second electrode frame EF2. The reinforcing molding member 250 may be formed together in the process of forming the first molding member 200. The reinforcing molding member 250 may include the same material as a material of the first molding member 200.

A first chip bonding wire CW1' may connect the second pad 180B of the first semiconductor light emitting device 100A to the electrodeless frame CF. Similarly, a second inter-chip bonding wire CW2' may connect the first pad 180A of the second semiconductor light emitting device 100B to the electrodeless frame CF. Accordingly, the second pad 180B of the first semiconductor light emitting device 100A may be electrically connected to the first pad 180A of the second semiconductor light emitting device 100B through the electrodeless frame CF.

The second molding member 300 may be disposed on the first molding member 200 to surround the first semiconductor light emitting device 100A and the second semiconductor light emitting device 100B, the first bonding wiring BW1 and the second bonding wire BW2, and first inter-chip bonding wire CW1' and the second inter-chip bonding wire CW2'.

As described above, by providing the reinforcing molding member 250 for the electrodeless frame CF, the electrodeless frame CF may be stably supported in the injection molding process such that the light emitting device package 500C having improved reliability may be provided.

Figure 10:
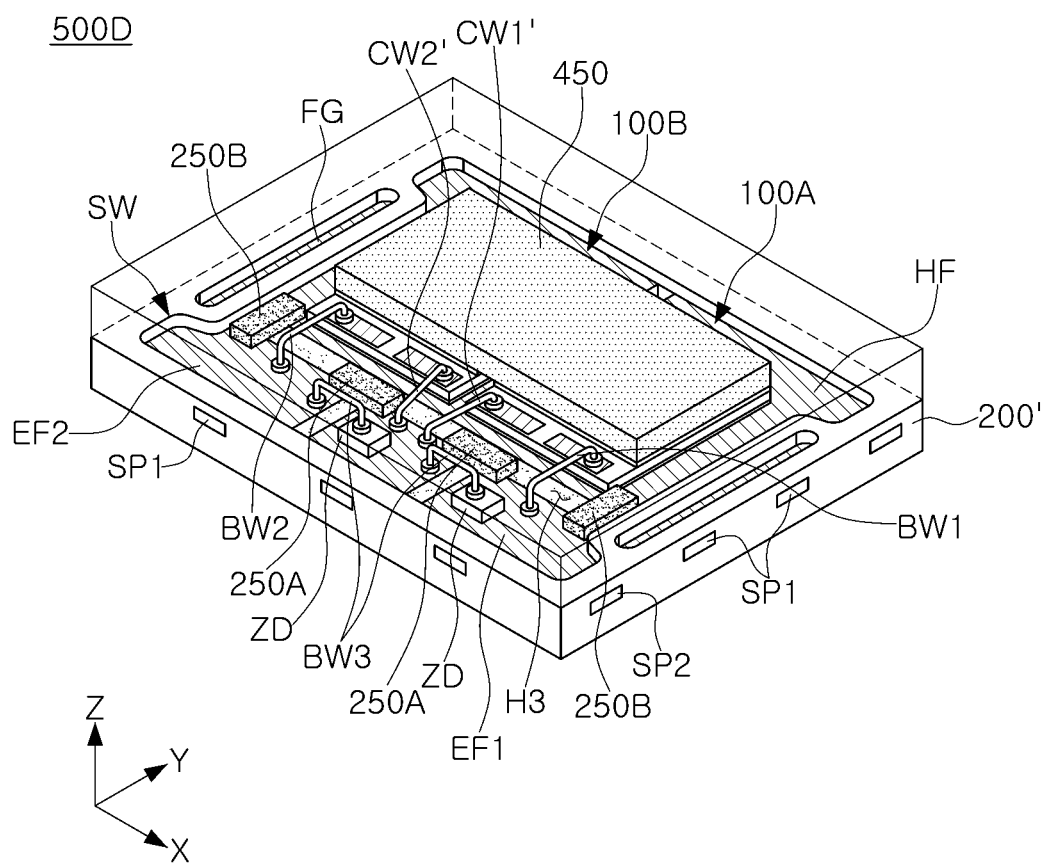
FIG. 10 is a perspective diagram illustrating a light emitting device package according to an example embodiment of the present disclosure.
Figure 11:
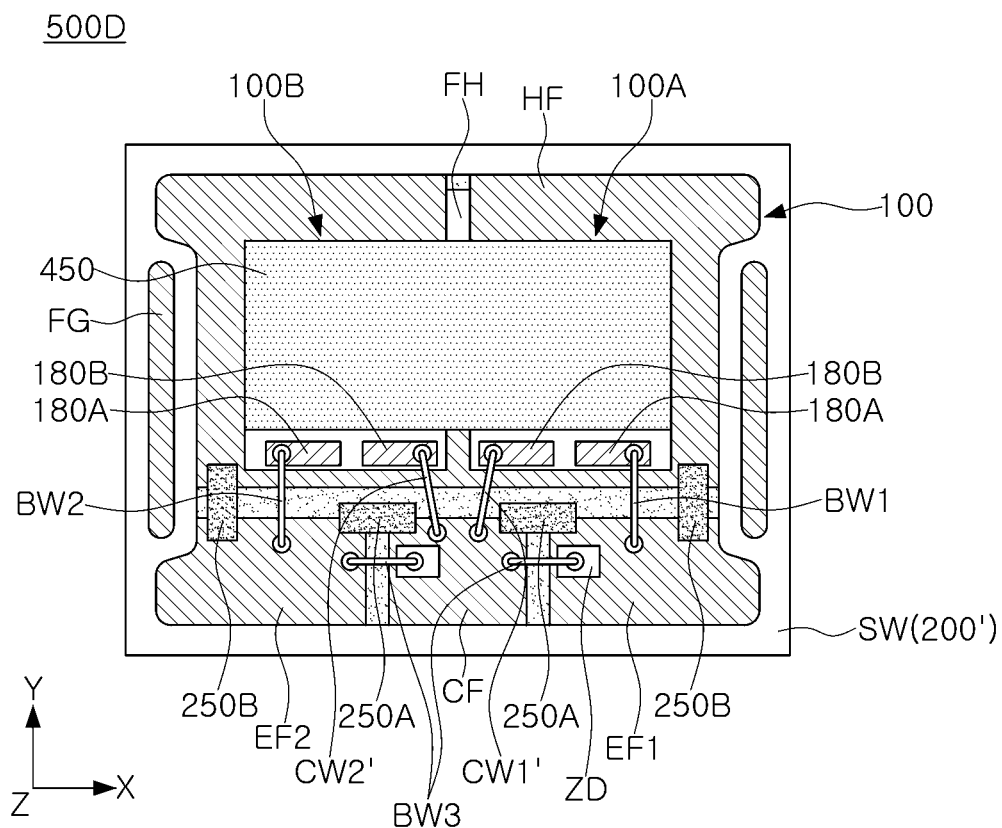
FIG. 11 is a plan diagram illustrating the light emitting device package of FIG. 10 according to the example embodiment of the present disclosure.

FIGS. 10 and 11 are a perspective diagram and a plan diagram illustrating a light emitting device package according to an example embodiment.

Referring to FIGS. 10 and 11, a light emitting device package 500D according to the example embodiment may be similar to the light emitting device package 500C illustrated in FIG. 9 other than a configuration in which additional reinforcing molding members are disposed, a configuration in which an additional one of a Zener diode ZD is provided, and a configuration in which the structure of the first molding member is different. Also, the elements in the example embodiment may be understood with reference to the description of the same or similar elements of the light emitting device package 500C illustrated in FIG. 9 unless otherwise specified.

The reinforcing molding members employed in the example embodiment may include a plurality of a first reinforcing molding member 250A and a plurality of a second reinforcing molding member 250B disposed on the first molding member 200'.

Similarly to the aforementioned embodiment, the plurality of the first reinforcing molding member 250A may be disposed throughout one area of the first electrode frame EF1 and the second electrode frame EF2, adjacent to one area of the electrodeless frame CF. The plurality of the second reinforcing molding member 250B may be disposed throughout another area of the first electrode frame EF1 and the second electrode frame EF2 and an adjacent area of the heat dissipation frame HF. As described above, the reinforcing molding members may be disposed in various areas to stably support the other frame elements.

The first molding member 200' employed in the example embodiment may have a sidewall structure SW protruding along an edge. The sidewall structure SW may have a structure surrounding the heat dissipation frame HF in which the first semiconductor light emitting device 100A and the second semiconductor light emitting device 100B are disposed, and the first electrode frame EF1 and the second electrode frame EF2. The first reinforcing molding member 250A and the second reinforcing molding member 250B may have a thickness corresponding to a height of the sidewall structure SW. The sidewall structure SW may be formed to partially cover an upper surface of the heat dissipation frame HF and upper surfaces of the first electrode frame EF1 and the second electrode frame EF2. The sidewall structure SW may include a groove structure FG on both sides thereof. By including the groove structure FG, the first molding member 200 may be firmly coupled to the second molding member 300 formed in a subsequent process.

The heat dissipation frame HF employed in the example embodiment may include a hole structure FH between the first semiconductor light emitting device 100A and the second semiconductor light emitting device 100B. Also, the Zener diode ZD may be disposed on the first electrode frame EF1. In this case, the Zener diode ZD may be electrically connected to the second electrode frame EF2 by a third bonding wire BW3.

Figure 12:
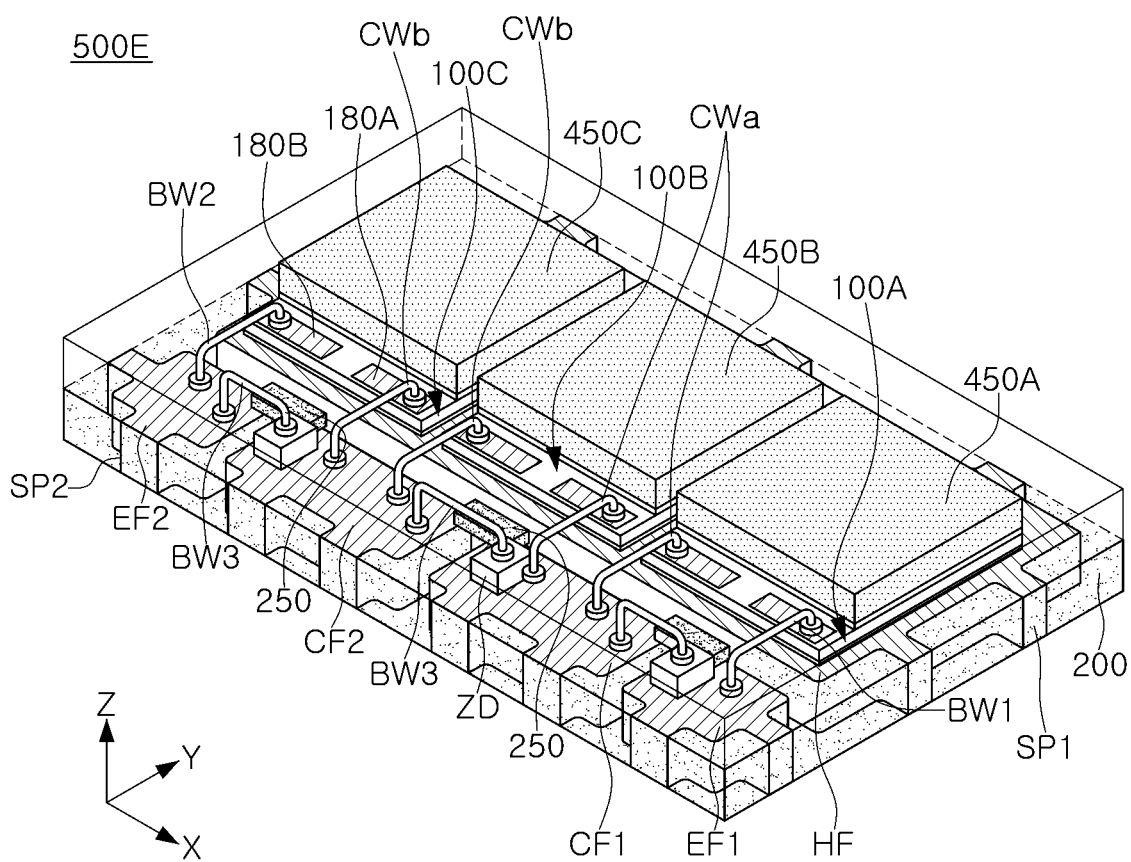
FIG. 12 is a perspective diagram illustrating a light emitting device package according to an example embodiment of the present disclosure.

FIG. 12 is a perspective diagram illustrating a light emitting device package according to an example embodiment.

Referring to FIG. 12, the light emitting device package 500E according to the example embodiment may be similar to the light emitting device package 500C illustrated in FIG. 9 other than a changed configuration of the lead frame LE a configuration in which first to third wavelength conversion layers 450A, 450B, and 450C are separated from each other, and a configuration in which a Zener diode ZD is additionally provided as the light emitting device package 500E may include first to third semiconductor light emitting devices 100A, 100B, and 100C. Also, the elements in the example embodiment may be understood with reference to the description of the same or similar elements of the light emitting device package 500C illustrated in FIG. 9 unless otherwise specified.

The light emitting device package 500E according to the example embodiment may include a lead frame LF surrounded by a first molding member 200 and first to third semiconductor light emitting devices 100A, 100B, and 100O surrounded by a second molding member 300 and disposed on the lead frame LF.

The lead frame LF may include a heat dissipation frame HF in which the first to third semiconductor light emitting devices 100A, 100B, and 100C are disposed, a first electrode frame EH and a second electrode frame EF2 arranged adjacent to one side of the heat dissipation frame EF1 and a first electrodeless frame CF1 and a second electrodeless frame CF2 arranged side by side between the first electrode frame EF1 and the second electrode frame EF2.

The first pad 180A of the first semiconductor light emitting device 100A may be connected to the first electrode frame EF1 by a first bonding wire BW1, and the second pad 180B of the third semiconductor light emitting device 1000 may be connected to the second electrode frame EF2 by a second bonding wire BW2. Three of the Zener diode ZD may be disposed in the first electrode frame the first electrodeless frame CF1, and the second electrodeless frame CF2, respectively, and may be electrically connected to the first electrodeless frame CF1, the second electrodeless frame CF2 and the second electrode frame EF2.

The light emitting device package 500E according to the example embodiment may include three of the reinforcing molding member 250 disposed on the first molding member 200. Similarly to the example embodiment in FIG. 9, two of the reinforcing molding member 250 may be disposed throughout one area of the first electrode frame EF1 and the second electrode frame EF2 adjacent to one area of the first electrodeless frame CF1 and the second electrodeless frame CF2. The other one of the reinforcing molding member 50 may be disposed between adjacent areas of the first electrodeless frame CF1 and the second electrodeless frame CF2. The reinforcing molding member 250 may be formed together in the process of forming the first molding member 200. The reinforcing molding member 250 may include the same material as a material of the first molding member 200.

First inter-chip bonding wires CWa may connect the second pad 180B of the first semiconductor light emitting device 100A and the first pad 180A of the second semiconductor light emitting device 100B to the first electrodeless frame CF1. Similarly, second inter-chip bonding wires CWb may connect the second pad 180B of the second semiconductor light emitting device 100B and the first pad 180A of the third semiconductor light emitting device 100C to the second electrodeless frame CF2. Accordingly, the first to third semiconductor light emitting devices 100A, 100B, and 100C may be connected to each other in series through the first electrodeless frame CF1 and the second electrodeless frame CF2.

The first to third semiconductor light emitting devices 100A, 100B, and 100C may be disposed side by side in one direction (x direction) on the heat dissipation frame HF. The heat dissipation frame HF may have an area larger than each area of the first electrode frame EF1 and the second electrode frame EF2. In example embodiments, the heat dissipation frame HF may be separated similarly to the first electrodeless frame CF1 and the second electrodeless frame CF2 and may be provided as a plurality of heat dissipation frames.

The first to third wavelength conversion layers 450A, 450B, and 450C may be separately disposed on upper surfaces of the first to third semiconductor light emitting devices 100A, 100B, and 1000. The first to third wavelength conversion layers 450A, 450B, and 450C may have a sufficient area to cover upper surfaces of the first to third semiconductor light emitting devices 100A, 100B, and 100C.

FIGS. 13A to 13D are plan diagrams illustrating processes of a method of manufacturing a light emitting device package according to an example embodiment. The manufacturing process may be understood as a process of manufacturing the light emitting device package 500C illustrated in FIG. 9.

Figure 13A:
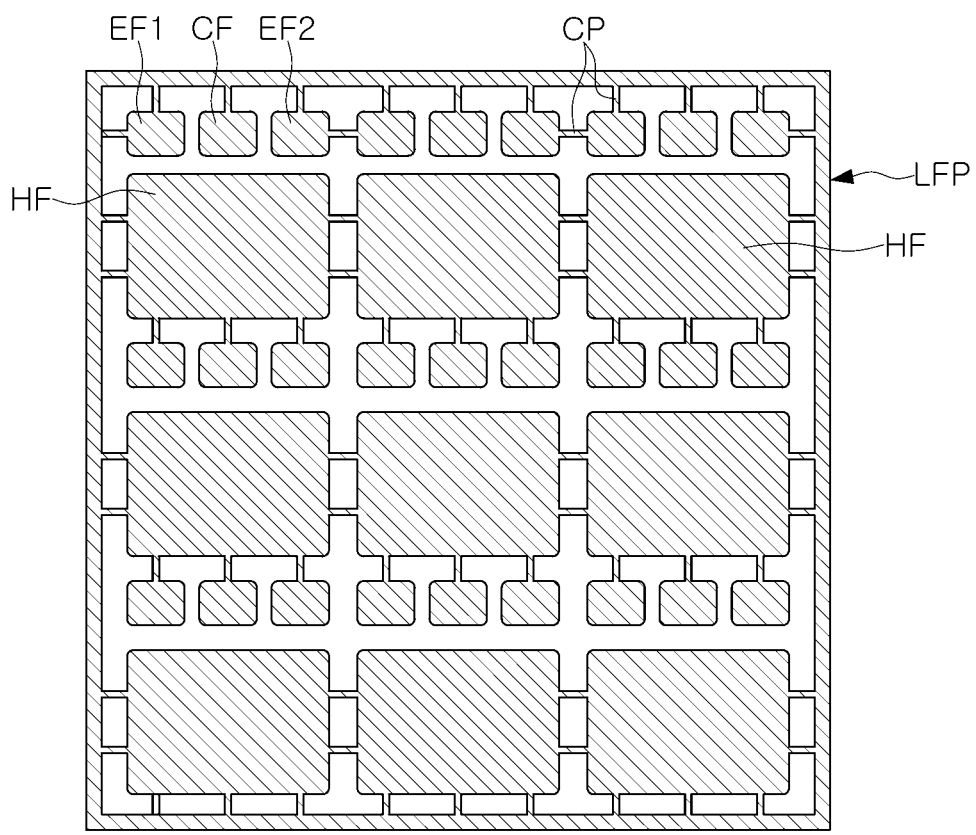
FIG. 13A is a first diagram illustrating a process of a method of manufacturing a light emitting device package according to an example embodiment of the present disclosure.

Referring to FIG. 13A, a lead frame panel LFP having a plurality of the lead frame LF may be manufactured.

The lead frame panel LFP may have a structure in which a plurality of the lead frame LF for a plurality of light emitting device packages may be connected to each other by a plurality of a connection portion CP. The plurality of the connection portion CP may be cut into individual packages and may provide a plurality of a first protrusion SP1 and a plurality of a second protrusion SP2 exposed on a side surface of the first molding member 200 described in the aforementioned embodiments. For example, the lead frame panel LFP may form a plurality of the lead frame LF in a pattern by etching and/or stamping a plate such as copper (Cu).

Each of the plurality of the lead frame LF may include a heat dissipation frame HF in which one or more of a semiconductor light emitting device 100 (in FIG. 9) is disposed, a first electrode frame EF1 and a second electrode frame EF2 arranged along one side of the heat dissipation frame HF, and an electrodeless frame CF disposed between the first electrode frame EF1 and the second electrode frame EF2.

Figure 13B:
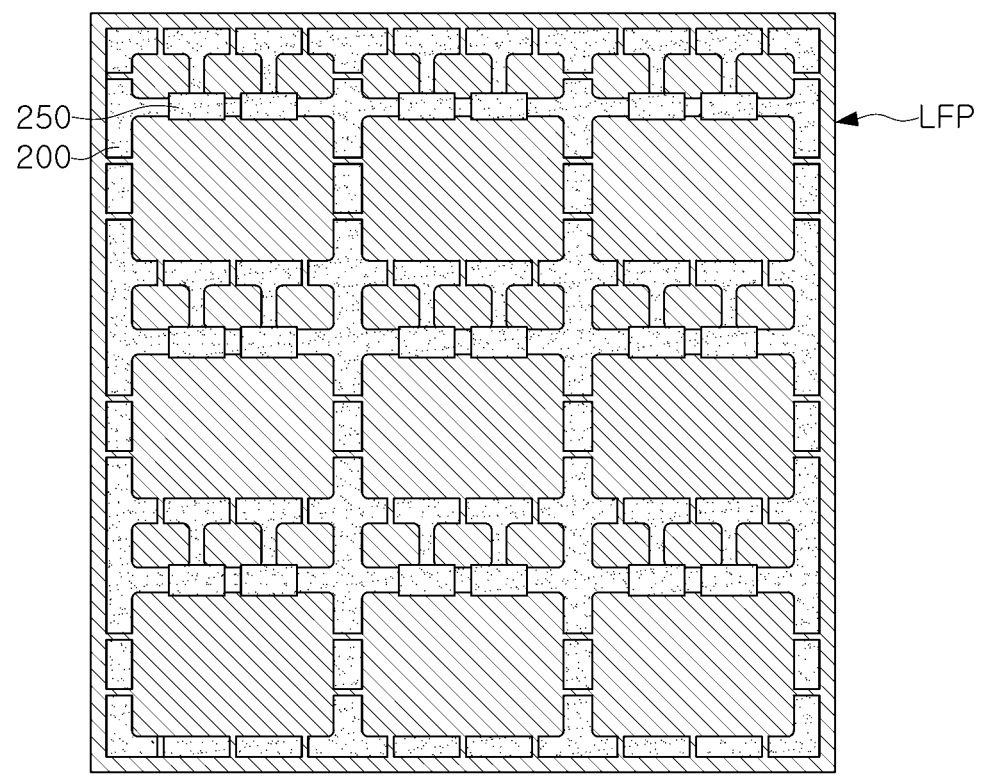
FIG. 13B is a second diagram t g processes of the method of manufacturing the light emitting device package according to the example embodiment of the present disclosure.

Thereafter, referring to FIG. 13B, the first molding member 200 may be formed by forming a first molding material on a lead frame panel LFP.

The first molding member 200 may fill an empty space of the lead frame panel LFP and may surround the plurality of the lead frame LF. Also, a reinforcing molding member 250 disposed between partial areas of the electrodeless frame CF and adjacent partial areas of the first electrode frame EF1 and the second electrode frame EF2 may be included. The reinforcing molding member 250 may be disposed on the upper surface of the first molding member 200 and may extend to each of partial areas of the first electrode frame EF1 and the second electrode frame EF2 adjacent to partial areas of the electrodeless frame CF.

The reinforcing molding member 250 may be formed by the same process together with the first molding member 200. For example, the first molding member 200 and the reinforcing molding member 250 may be formed by injection molding or transfer molding. For example, the first molding member 200 and the reinforcing molding member 250 may be formed of an epoxy molding compound.

An upper surface of the first molding member 200 and an upper surface of the lead frame panel LFP may be disposed on be same plane, and a lower surface of the first molding member 200 anil a lower surface of the lead frame panel LFP may be disposed on the same plane. In other words, a thickness of the first molding member 200 may be substantially the same as a thickness of the lead frame panel LFP.

Figure 13C:
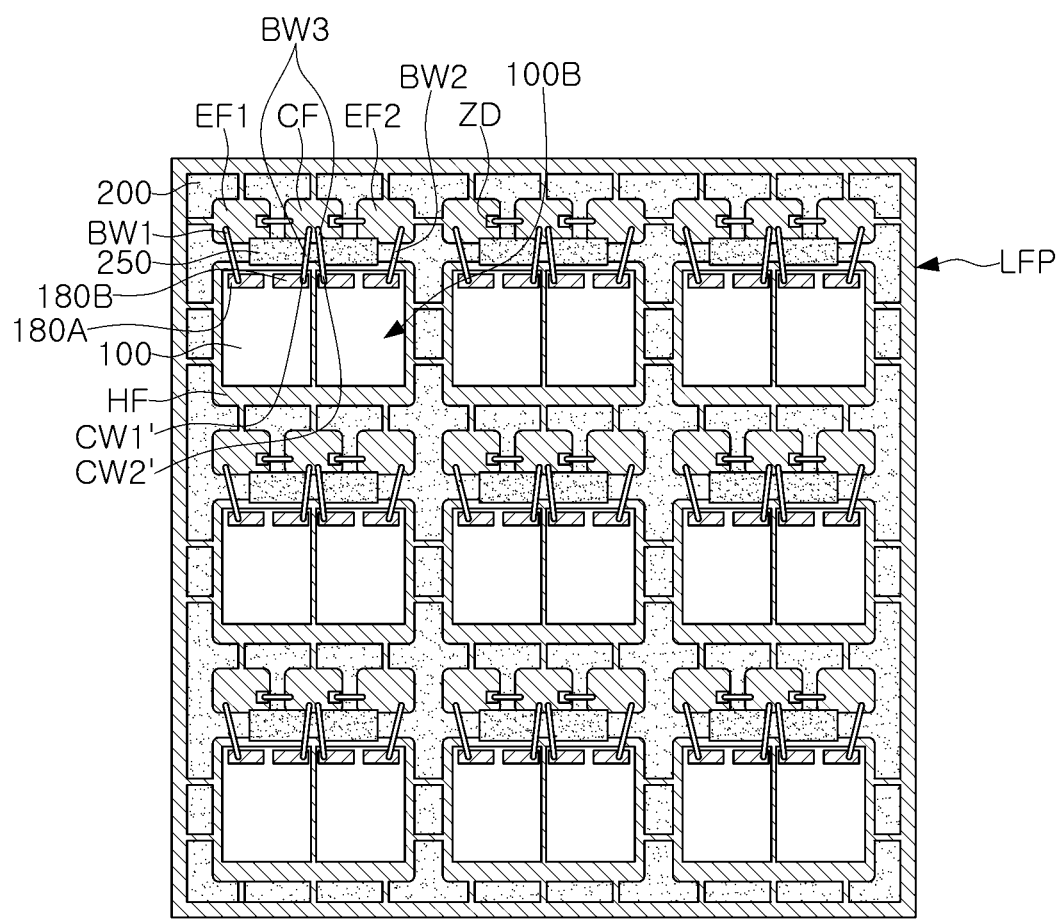
FIG. 13C is a third diagram illustrating processes of the method of manufacturing the light emitting device package according to the example embodiment of the present disclosure.

Thereafter, referring to FIG. 13C, a plurality of the first semiconductor light emitting device 100A and a plurality of the second semiconductor light emitting device 100B may be disposed on the lead frame panel LFP, and after the plurality of the first semiconductor light emitting device 100A and the plurality of the second semiconductor light emitting device 100B are disposed on the lead frame panel LFP, a Zener diode ZD, and a first bonding wire BW1 and a second bonding wire BW2 may be formed.

Two of the first semiconductor light emitting device 100A and two of the second semiconductor light emitting device 100B may be disposed on each heat dissipation frame HF. Lower surfaces (e.g., lower surfaces of the substrate 190) of the plurality of first semiconductor light emitting device 100A and the second semiconductor light emitting device 100B may be bonded to the heat dissipation frame HF using a thermal conductive bonding layer. Each of the plurality of the first semiconductor light emitting device 100A and the second semiconductor light emitting device 100B may include a first pad 180A and a second pad 180B, which may be disposed in an area of the upper surface of the substrate 190 adjacent to the heat dissipation frame HF.

The first pad 180A of the first semiconductor light emitting device 100A and the second pad 180B of the second semiconductor light emitting device 100B may be connected to the first electrode frame EF1 and the second electrode frame EF2 by the first bonding wire BW1 and the second bonding wire BW2, respectively. The bonding process may be performed by one of thermo-compression bonding and ultrasonic bonding, or thermal sonic bonding mixing thermo-compression bonding and ultrasonic bonding.

Figure 13D:
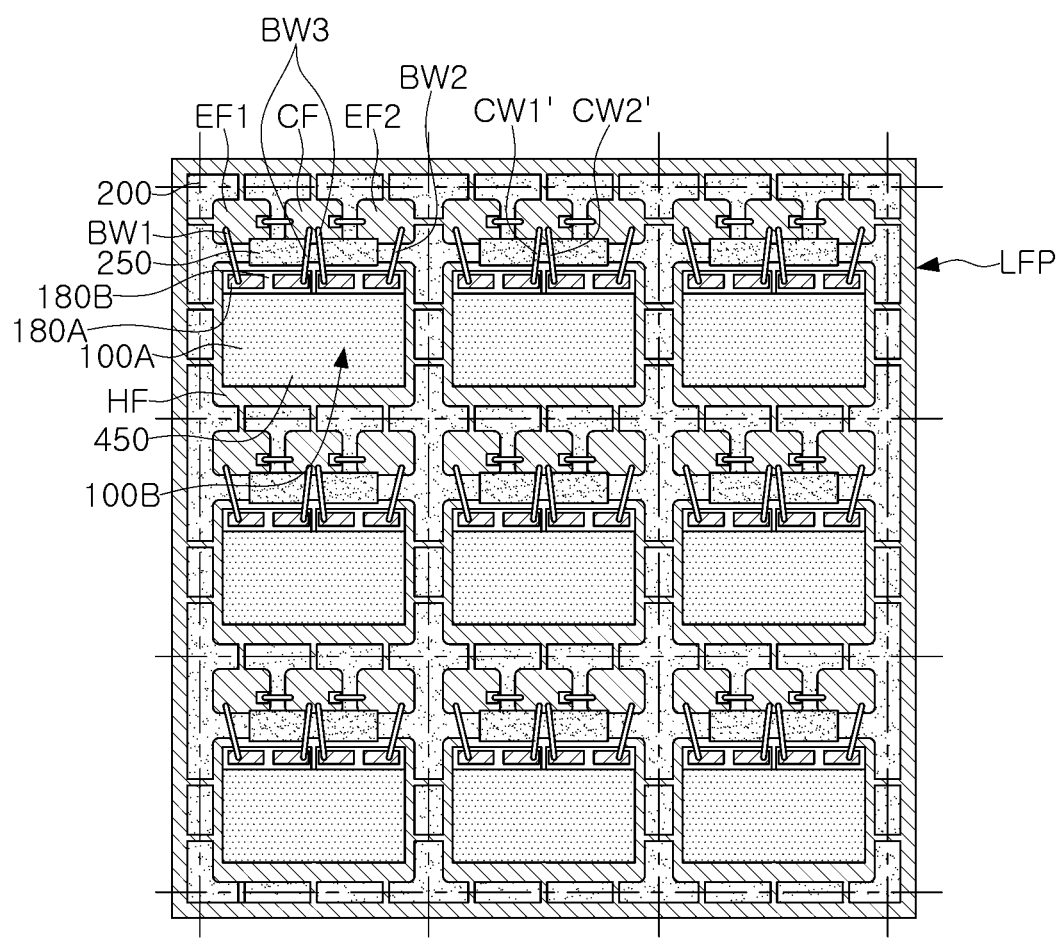
FIG. 13D is a fourth diagram illustrating processes of the method of manufacturing the light emitting device package according to the example embodiment of the present disclosure.

Thereafter, referring to FIG. 13D, the wavelength conversion layer 450 may disposed on an upper surface of each of the plurality of the first semiconductor light emitting device 100A and the second semiconductor light emitting device 100B, and the second molding member 300 may be formed on the first molding member 200 and the lead frame panel LFP to surround the first semiconductor light emitting device 100A and the second semiconductor light emitting device 100B and the first bonding wire BW1 and the second bonding wire BW2. Other elements including the lead frame panel LFP may be cut through a package cutting line (indicated by a dotted line) and may be divided into separate ones of the light emitting device package 500C illustrated in FIG. 9.

In example embodiments, the wavelength conversion layer 450 may have a plate shape. The wavelength conversion layer 450 may include a resin including a wavelength conversion material. For example, the wavelength conversion material may be a fluorescent material, and the resin may be silicone resin, epoxy resin, or a resin mixture thereof. An area of the wavelength conversion layer 450 may be disposed to cover most of an arrangement area of the first semiconductor light emitting device 100A and the second semiconductor light emitting device 100B.

The second molding member 300 may also have a plate shape similarly to the first molding member 200. The second molding member 300 may protect a plurality of the semiconductor light emitting device 100 from external influences such as contamination and impact. Also, the second molding member 300 may protect the first bonding wire BW1 and the second bonding wire BW2. To this end, a thickness of the second molding member 300 may be formed to surround the first semiconductor light emitting device 100A and the second semiconductor light emitting device 100B and the wavelength conversion layer 450. The second molding member 300 may expose an upper surface of the wavelength conversion layer 450.

Similarly to the first molding member 200, the second molding member 300 may be formed by injection molding or transfer molding. Similarly to the first molding member 200, the second molding member 300 may include a resin material including highly reflective powder. In example embodiments, the first molding member 200 and the second molding member 300 may include different materials.

A blade may cut the lead frame panel LFP, the second molding member 300 and the first molding member 200 along a package cutting line (indicated by a dotted line), and may physically divide components into separate ones of the light emitting device package 500C (refer to FIG. 9). In each light emitting device package 500C that are physically divided, the first molding member 200 may surround the lead frame LF and may be formed around the lead frame LF. The lead frame LF may be divided into the heat dissipation frame HF, the first electrode frame EF1 and the second electrode frame EF2, and the electrodeless frame CF by the first molding member 200. In other words, the lead frame LF may be electrically divided by the first molding member 200. Each light emitting device package 500 may include a first protrusion SP1 and a second protrusion SP2 exposed to side surfaces of the first molding member 200. As described above, the first protrusion SP1 and the second protrusion SP2 may be understood as a portion of the connection portion CP (refer to FIG. 13A) that is cut.

According to the aforementioned example embodiments, a light emitting device package which may effectively emit heat emitted from a light emitting device and may have improved reliability may be provided.

While the example embodiments have been illustrated and described above, it will be apparent to those skilled in the art that modifications and variations could be made without departing from the scope of the present disclosure.

What is claimed is:

1. A light emitting device package, comprising:
   a heat dissipation frame;
   a first electrode frame and a second electrode frame arranged adjacent to one side of the heat dissipation frame;
   a first molding surrounding the heat dissipation frame, the first electrode frame, and the second electrode frame;
   a first semiconductor light emitting device disposed on the heat dissipation frame, the first semiconductor light emitting device comprising a first semiconductor light emitting structure and a first pad and a second pad connected to the first semiconductor light emitting structure;
   a second semiconductor light emitting device disposed on the heat dissipation frame, the second semiconductor light emitting device comprising a second semiconductor light emitting structure and a first pad and a second pad connected to the second semiconductor light emitting structure;
   a wavelength conversion layer disposed on the first semiconductor light emitting device and the second semiconductor light emitting device;
   a first bonding wire connected to the first pad of the first semiconductor light emitting device and the first electrode frame;
   a second bonding wire connected to the second pad of the second semiconductor light emitting device and the second electrode frame;
   an inter-chip bonding wire connecting the second pad of the first semiconductor light emitting device to the first pad of the second semiconductor light emitting device; and
   a second molding disposed on the first molding and surrounding the first semiconductor light emitting device, the second semiconductor light emitting device, the first bonding wire, the second bonding wire, and the inter-chip bonding wire,
   wherein:
      the heat dissipation frame includes a groove formed between the first semiconductor light emitting device and the second semiconductor light emitting device, or the first semiconductor light emitting device and the second semiconductor light emitting device are provided on a same substrate.

2. The light emitting device package of claim 1, wherein the inter-chip bonding wire has a height lower than a level of an upper surface of the wavelength conversion layer.

3. The light emitting device package of claim 1, wherein the wavelength conversion layer is exposed from an upper surface of the second molding.

4. The light emitting device package of claim 3, wherein the wavelength conversion layer has an upper surface coplanar with the upper surface of the second molding.

5. The light emitting device package of claim 1, wherein each of the first bonding wire and the second bonding wire has a height lower than a level of an upper surface of the wavelength conversion layer.

6. The light emitting device package of claim 1, wherein each of the first molding and the second molding comprises a resin that includes a high-reflective powder.

7. The light emitting device package of claim 1, wherein the first pad and the second pad of the first semiconductor light emitting device and the first pad and the second pad of the second semiconductor light emitting device are arranged linearly along the one side of the heat dissipation frame.

8. The light emitting device package of claim 1,
wherein the first semiconductor light emitting device comprises a first substrate having an upper surface divided into a first area adjacent to the one side of the heat dissipation frame and a second area other than the first area, and a lower surface in contact with the heat dissipation frame,
wherein the first pad and the second pad of the first semiconductor light emitting device are disposed in the first area of the first substrate, and the first semiconductor light emitting structure is disposed in the second area of the first substrate,
wherein the second semiconductor light emitting device comprises a second substrate having an upper surface divided into a first area adjacent to the one side of the heat dissipation frame and a second area other than the first area, and a lower surface in contact with the heat dissipation frame, and
wherein the first pad and the second pad of the second semiconductor light emitting device are disposed in the first area of the second substrate, and the second semiconductor light emitting structure is disposed in the second area of the second substrate.

9. The light emitting device package of claim 8, further comprising:
a thermal conductive bonding layer disposed between the first substrate and the second substrate, and the heat dissipation frame, such that the first substrate and the second substrate are on one side of the thermal conductive bonding layer and the heat dissipation frame is on another side of the thermal conductive bonding layer.

10. The light emitting device package of claim 1, wherein the heat dissipation frame includes the groove formed between the first semiconductor light emitting device and the second semiconductor light emitting device.

11. The light emitting device package of claim 1,
wherein the first semiconductor light emitting device and the second semiconductor light emitting device are provided on a same substrate,
wherein the same substrate has an upper surface divided into a first area adjacent to the one side of the heat dissipation frame and a second area other than the first area, and a lower surface in contact with the heat dissipation frame, and
wherein the first pad and the second pad of the first semiconductor light emitting device and the first pad and the second pad of the second semiconductor light emitting device are disposed side by side in the first area of the same substrate, and the first semiconductor light emitting structure and the second semiconductor light emitting structure are disposed side by side in the second area of the same substrate.

12. The light emitting device package of claim 1, wherein the wavelength conversion layer comprises a first wavelength conversion layer and a second wavelength conversion layer disposed on the first semiconductor light emitting structure and the second semiconductor light emitting structure, respectively.

13. The light emitting device package of claim 1, wherein the first molding comprises a sidewall structure surrounding the heat dissipation frame, the first electrode frame, and the second electrode frame.

14. A light emitting device package, comprising:
a heat dissipation frame;
a first electrode frame and a second electrode frame arranged adjacent to one side of the heat dissipation frame;
an electrodeless frame disposed between the first electrode frame and the second electrode frame;
a first molding surrounding the heat dissipation frame, the first electrode frame, the second electrode frame, and the electrodeless frame;
at least one reinforcing molding disposed on the first molding and covering one area of the electrodeless frame and at least one area of the first electrode frame or the second electrode frame;
a first semiconductor light emitting device disposed on the heat dissipation frame, the first semiconductor light emitting device comprising a first semiconductor light emitting structure and a first pad and a second pad connected to the first semiconductor light emitting structure;
a second semiconductor light emitting device disposed on the heat dissipation frame, the second semiconductor light emitting device comprising a second semiconductor light emitting structure and a first pad and a second pad connected to the second semiconductor light emitting structure;
a wavelength conversion layer disposed on the first semiconductor light emitting device and the second semiconductor light emitting device;
a first bonding wire connected to the first pad of the first semiconductor light emitting device and the first electrode frame;
a second bonding wire connected to the second pad of the second semiconductor light emitting device and the second electrode frame;
a first inter-chip bonding wire connecting the second pad of the first semiconductor light emitting device to the electrodeless frame;
a second inter-chip bonding wire connecting the first pad of the second semiconductor light emitting device to the electrodeless frame; and
a second molding surrounding the first semiconductor light emitting device, the second semiconductor light emitting device, the first bonding wire, the second bonding wire, the first inter-chip bonding wire, and the second inter-chip bonding wire, wherein the at least one reinforcing molding comprises:
  a first reinforcing molding comprising a first body that covers a first area of the electrodeless frame and one area of the first electrode frame; and
  a second reinforcing molding comprising a second body that covers a second area of the electrodeless frame and one area of the second electrode frame.

15. The light emitting device package of claim 14, wherein
  a first end of the first body of the first reinforcing molding is on the first area, and a second end of the first body, opposite to the first end of the first body, is on the one area of the first electrode frame, and
  a first end of the second body of the second reinforcing molding is on the second area, and a second end of the second body, opposite to the first end of the second body, is on the one area of the second electrode frame.

16. The light emitting device package of claim 15, wherein at least one of the first reinforcing molding and the second reinforcing molding comprises a plurality of reinforcing moldings.

17. The light emitting device package of claim 14, wherein the at least one reinforcing molding comprises a same material as a material of the first molding.

18. The light emitting device package of claim 14, wherein the first molding comprises a sidewall structure that surrounds the heat dissipation frame, the first electrode frame, the second electrode frame, and the electrodeless frame, and
  wherein an upper surface of the at least one reinforcing molding is at a same height as an upper surface of the sidewall structure of the first molding.

19. A light emitting device package, comprising:
a heat dissipation frame;
a first electrode frame and a second electrode frame arranged adjacent to one side of the heat dissipation frame;
a first molding surrounding the heat dissipation frame, the first electrode frame, and the second electrode frame;
a plurality of semiconductor light emitting devices disposed on the heat dissipation frame along the one side of the heat dissipation frame and each comprising a first pad and a second pad, the plurality of semiconductor light emitting devices comprising a first semiconductor light emitting device disposed at one end of the plurality of semiconductor light emitting devices, and a second semiconductor light emitting device disposed at an opposite end of the plurality of semiconductor light emitting devices;
a wavelength conversion layer disposed on the plurality of semiconductor light emitting devices;
a first bonding wire connected to the first pad of the first semiconductor light emitting device and the first electrode frame;
a second bonding wire connected to the second pad of the second semiconductor light emitting device and the second electrode frame;
a plurality of inter-chip bonding wires that each connect the first pad of a respective one of the plurality of semiconductor light emitting devices to the second pad of another respective one of the plurality of semiconductor light emitting devices that is adjacent to the respective one of the plurality of semiconductor light emitting devices; and
a second molding surrounding the plurality of semiconductor light emitting devices, the first bonding wire, the second bonding wire, and the plurality of inter-chip bonding wires,
wherein:
  the heat dissipation frame includes a groove formed between the first semiconductor light emitting device and the second semiconductor light emitting device, or
  the first semiconductor light emitting device and the second semiconductor light emitting device are provided on a same substrate.

20. The light emitting device package of claim 19,
wherein the wavelength conversion layer has an upper surface coplanar with an upper surface of the second molding, and
wherein at least one inter-chip bonding wire from among the plurality of inter-chip bonding wires has a height lower than a level of the upper surface of the wavelength conversion layer.

* * * * *